United States Patent
Mizukami et al.

(10) Patent No.: US 8,557,695 B2
(45) Date of Patent: Oct. 15, 2013

(54) NONVOLATILE SEMICONDUCTOR STORAGE DEVICE, AND METHOD FOR CONTROLLING NONVOLATILE SEMICONDUCTOR STORAGE DEVICE

(75) Inventors: Makoto Mizukami, Kawasaki (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 247 days.

(21) Appl. No.: 12/974,128

(22) Filed: Dec. 21, 2010

(65) Prior Publication Data
US 2011/0085377 A1 Apr. 14, 2011

Related U.S. Application Data

(62) Division of application No. 12/244,307, filed on Oct. 2, 2008, now Pat. No. 7,884,417.

(30) Foreign Application Priority Data

Oct. 3, 2007 (JP) ................................ 2007-259827

(51) Int. Cl.
*H01L 21/28* (2006.01)

(52) U.S. Cl.
USPC ...................... 438/591; 365/184; 257/E21.21

(58) Field of Classification Search
None
See application file for complete search history.

(56) References Cited

U.S. PATENT DOCUMENTS

| | | | |
|---|---|---|---|
| 5,599,724 A | 2/1997 | Yoshida | |
| 5,707,885 A | 1/1998 | Lim | |
| 8,178,875 B2 * | 5/2012 | Kiyotoshi | 257/41 |
| 8,361,862 B2 * | 1/2013 | Fukuzumi et al. | 438/257 |
| 2002/0126532 A1 | 9/2002 | Matsunaga et al. | |
| 2005/0056869 A1 | 3/2005 | Ichige et al. | |
| 2006/0141679 A1 | 6/2006 | Subramanian et al. | |
| 2007/0158736 A1 | 7/2007 | Arai et al. | |
| 2007/0252201 A1 | 11/2007 | Kito et al. | |
| 2008/0073635 A1 | 3/2008 | Kiyotoshi et al. | |
| 2008/0128780 A1 | 6/2008 | Nishihara et al. | |

(Continued)

FOREIGN PATENT DOCUMENTS

| | | |
|---|---|---|
| CN | 1374700 A | 10/2002 |
| CN | 1789987 A | 6/2006 |

(Continued)

OTHER PUBLICATIONS

Tetsuo Endoh, et al., "Novel Ultrahigh-Density Flash Memory With a Stacked-Surrounding Gate Transistor (S-SGT) Structured Cell", IEEE Transcations on Electron Devices, vol. 50, No. 4, Apr. 2003, pp. 945-951.

(Continued)

*Primary Examiner* — Seahvosh Nikmanesh
(74) *Attorney, Agent, or Firm* — Oblon, Spivak, McClelland, Maier & Neustadt, L.L.P.

(57) ABSTRACT

According to an aspect of the present invention, there is provided, a nonvolatile semiconductor storage device including: a substrate; a stacked portion that includes a plurality of conductor layers and a plurality of insulation layers alternately stacked on the substrate, at least one layer of the plurality of conductor layers and the plurality of insulation layers forming a marker layer; a charge accumulation film that is formed on an inner surface of a memory plug hole that is formed in the stacked portion from a top surface to a bottom surface thereof; and a semiconductor pillar that is formed inside the memory plug hole through the charge accumulation film.

4 Claims, 22 Drawing Sheets

(56) References Cited

U.S. PATENT DOCUMENTS

| | | |
|---|---|---|
| 2008/0173928 A1 | 7/2008 | Arai et al. |
| 2009/0283819 A1 | 11/2009 | Ishikawa et al. |
| 2010/0038699 A1 | 2/2010 | Katsumata et al. |
| 2010/0059811 A1 | 3/2010 | Sekine et al. |

FOREIGN PATENT DOCUMENTS

| | | |
|---|---|---|
| JP | 9-306910 A | 11/1997 |
| JP | 11-135742 | 5/1999 |
| JP | 2000-222895 | 8/2000 |
| JP | 2001-185695 | 7/2001 |
| JP | 2003-78044 | 3/2003 |
| JP | 2007-180389 | 7/2007 |

OTHER PUBLICATIONS

Office Action issued Jan. 29, 2013 in Japanese Patent Application No. 2007-259827 with English language translation.

Office Action issued Jul. 10, 2012, in Japanese Patent Application No. 2007-259827 with English translation.

* cited by examiner

NONVOLATILE SEMICONDUCTOR STORAGE DEVICE, AND METHOD FOR CONTROLLING NONVOLATILE SEMICONDUCTOR STORAGE DEVICE

CROSS-REFERENCE TO RELATED APPLICATIONS

This application is a division of and claims the benefit of priority under 35 U.S.C. §120 from U.S. Ser. No. 12/244,307 filed Oct. 2, 2008 (now U.S. Pat. No. 7,884,417 issued Feb. 8, 2011), and claims the benefit of priority under 35 U.S.C. §119 from Japanese Patent Application No. 2007-259827 filed Oct. 3, 2007, the entire contents of each of which are incorporated herein by reference.

BACKGROUND OF THE INVENTION

1. Field of the Invention

An aspect of the present invention relates to a nonvolatile semiconductor storage device and a method for controlling the nonvolatile semiconductor storage device.

2. Description of the Related Art

A demand for compact large-capacity nonvolatile semiconductor storage devices is increasing. In order to achieve miniaturization and high capacity, a device in which semiconductor storage elements, such as memory cell transistors, are three-dimensionally arranged is proposed (see; for instance, JP-2003-078044-A, U.S. Pat. Nos. 5,599,724-B, 5,707,885-B, Masuoka et al., "Novel Ultra high-Density Flash Memory With a Stacked-Surrounding Gate Transistor (S-SGT) Structured Cell," IEEE TRANSACTIONS ON ELECTRONIC DEVICES, VOL., 50, No. 4, pp. 945 TO 951, April 2003).

SUMMARY OF THE INVENTION

According to an aspect of the present invention, there is provided, a nonvolatile semiconductor storage device including: a substrate; a stacked portion that includes a plurality of conductor layers and a plurality of insulation layers alternately stacked on the substrate, at least one layer of the plurality of conductor layers and the plurality of insulation layers forming a marker layer; a charge accumulation film that is formed on an inner surface of a memory plug hole that is formed in the stacked portion from a top surface to a bottom surface thereof; and a semiconductor pillar that is formed inside the memory plug hole through the charge accumulation film.

According to another aspect of the present invention, there is provided a method for manufacturing a nonvolatile semiconductor storage device, the method including: forming a lower stacked portion on a substrate, by alternately stacking a plurality of conductor layers and a plurality of insulation layers; forming a marker layer on the lower stacked portion; forming an upper stacked portion on the marked layer, by alternately stacking a plurality of conductor layers and a plurality of insulation layers; forming a memory plug hole in the upper stacked portion by performing a first etching process; further forming the memory plug hole in the marker layer by performing a second etching process; further forming the memory plug in the lower stacked portion by performing a third etching process; forming a charge accumulation film on an inner surface of the memory plug hole; and forming a semiconductor pillar inside the memory plug hole through the charge accumulation film.

According to still another aspect of the present invention, there is provided a method for controlling a nonvolatile semiconductor storage device, the nonvolatile semiconductor storage device including: a substrate; a stacked portion that includes a plurality of conductor layers and a plurality of insulation layers alternately stacked on the substrate; and a semiconductor pillar that is embedded inside the stacked portion, wherein a first select transistor and a second select transistor are formed at ends of the semiconductor pillar, wherein at least one layer of the conductor layers form a third select transistor with the semiconductor pillar; wherein the other layers of the conductor layers each form a memory cell transistor with the semiconductor pillar, the method including: switching the first select transistor to an off-state; switching the second select transistor and the third select transistor to an on-state; supplying a voltage on the semiconductor pillar; switching the third select transistor to the off-state; writing data into a memory cell transistor located between the third select transistor and the second select transistor.

BRIEF DESCRIPTION OF THE DRAWINGS

Embodiment may be described in detail with reference to the accompanying drawings, in which.

DETAILED DESCRIPTION OF THE INVENTION

Figure 1:
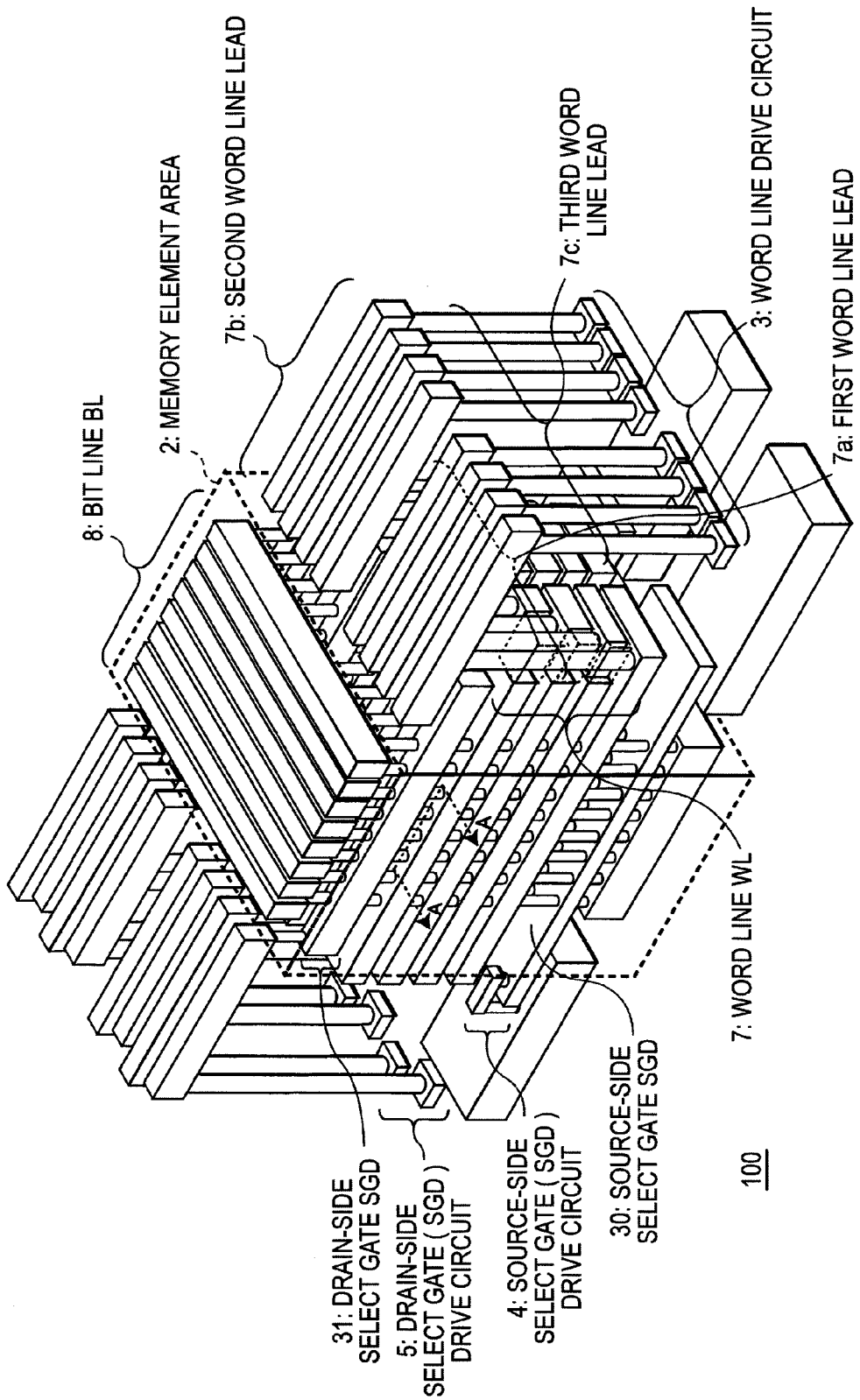
FIG. 1 is a diagrammatic view of a nonvolatile semiconductor storage device according to an embodiment.

Embodiments of the present invention will be described hereunder by reference to the drawings. The present invention is not limited to the embodiments provided below and can be practiced in various modes without departing from the scope of gist of the present invention. In the respective embodiments, like configurations are assigned like reference numerals, and it may be the case where their repeated explanations are omitted.

(First Embodiment)

FIG. 1 shows a schematic diagram of a nonvolatile semiconductor storage device 100 of a first embodiment. In the nonvolatile semiconductor storage device 100, there are formed a memory element area 2, a word-line drive circuit 3, a source-side select gate (SGS) drive circuit 4, a drain-side select gate (SGD) drive circuit 5, and the like. In the memory element area 2, there are formed a plurality of word lines WL7 stacked in a direction perpendicular to a principal plane of a semiconductor substrate and a plurality of semiconductor pillars (see reference numerals 301 to 304 in FIG. 2 to be described later) that extend from an upper surface of a multilayered section to the semiconductor substrate via the word lines WL7. The configuration of the memory element area 2 will be described later.

Source-side select gates (SGS) are arranged as bottom conductor layers of the multilayered section. The source-side select gates (SGS) are formed to surround the respective semiconductor pillars through gate insulation films. Consequently, first select transistor taking the source-side select gates (SGS) as gate electrodes are fabricated. In contrast, Drain-side select gates (SGD) are arranged as the top conductor layers of the multilayered section. The drain-side select gates (SGD) are formed to surround the respective semiconductor pillars through gate insulation films. Consequently, second select transistors taking the drain-side select gates (SGD) as gate electrodes are fabricated.

Ends of the respective word lines WL are formed in a stepwise shape in order to make a connection with respective one of second word line leads 7b. Contact holes are opened in stepwise areas of the word lines, and contacts serving as first word line leads 7a are created in the contact holes. The second word line leads 7b are connected to third word line leads 7c, and the third word line leads 7c are connected to the word line drive circuit 3.

In FIG. 1, the word lines WL7 are stacked in four layers. However, the present invention is not limited to four layers. The word lines may also be stacked in eight layers, 16 layers, 32 layers, or 64 layers. As a matter of course, the number of layers is not limited to a power of two and may also assume a Mersenne number, a prime number, a perfect number, an odd number, and the like.

Figure 2:
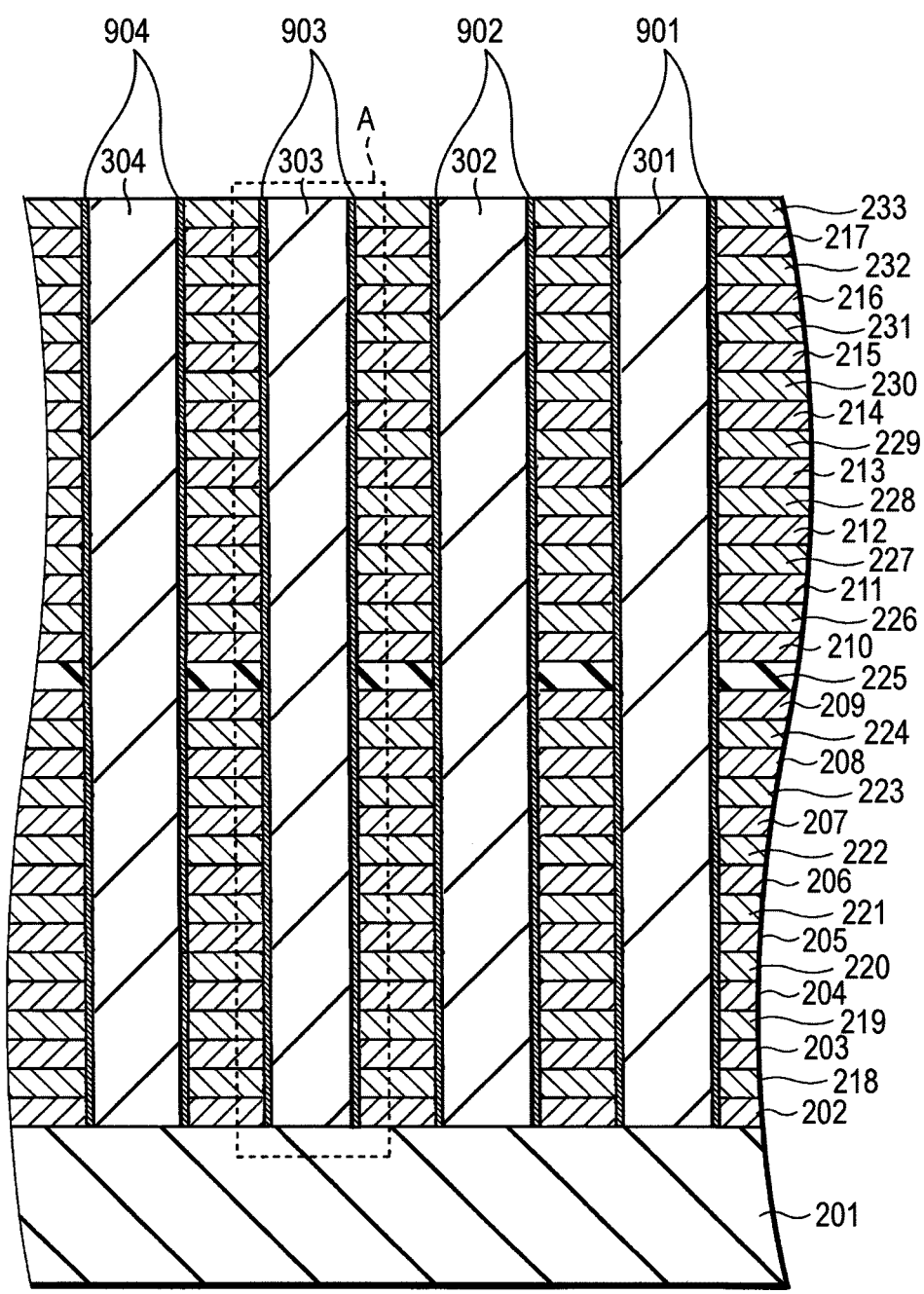
FIG. 2 is a view showing a state where conductor layers and insulation layers are alternately stacked in the nonvolatile semiconductor storage device according to the embodiment and where semiconductor pillars are formed on memory plug holes.

FIG. 2 shows a cross-sectional view taken along line A-A when the number of layers of word lines WL7 in the memory element area 2 shown in FIG. 1 is set to 16. Although unillustrated in FIG. 1, plate-shaped insulation layers 218, 219, 220, 221, 222, 223, 224, 225, 226, 227, 228, 229, 230, 231, 232, and 233 are formed alternately as layers to be sandwiched among plate-shaped conductor layers 202, 203, 204, 205, 206, 207, 208, 209, 210, 211, 212, 213, 214, 215, 216, and 217 that constitute the stacked word lines WL7. Specifically, the memory element area 2 has a multilayered structure in which the conductor layers and the insulation layers are stacked one on top of the other. A plurality of memory plug holes are opened so as to extend from an upper portion of the multilayered structure so as to reach the substrate layer, thereby exposing surfaces of the conductor layers and the insulation layers. Semiconductor pillars 301 to 304 are embedded in the memory plug holes through charge accumulation films 901 to 904. The semiconductor pillars 301 to 304 are formed continually on the surfaces of the conductor layers and the surfaces of the insulation layers through the charge accumulation films 901 to 904. Semiconductor elements are formed at intersection points between the semiconductor pillars and the conductor layers. These semiconductor elements operate as electrically-rewritable memory elements.

In FIG. 2 (and similarly in the other figures), a substrate layer 201 depicts, a part of the memory element area 2 shown in FIG. 1 below an upper insulation layer of the source-side select gates SGS. That is, the part below the lower-most word line is omitted for the sake of convenience. Similarly, apart of the drain-side select gates SGD are omitted for the sake of convenience. In FIG. 1, conductor layers that are stacked to constitute the word lines WL7 are four layers. However, as mentioned above, the number of conductor layers is 16 in FIG. 2. In the present invention, the number of conductor layers is not limited, and an arbitrary number, such as 32 and 64, can be taken.

As mentioned previously, the semiconductor pillars and the charge accumulation films embedded in the memory plug holes constitute memory elements. In the embodiment, an ONO film in which a silicon oxide film, a silicon nitride film and a silicon oxide film are sequentially stacked is used as the charge accumulation film. The ONO films 901 to 904 serving as the charge accumulation film are formed on outer side of the memory plug holes, and the semiconductor pillars 301 to 304 serving as the channel region are formed on inner side thereof. Each conductor layer is in contact with the charge accumulation film. By controlling the voltages of the conductor layers, the data writing, the data reading, and the like can be performed. That is, the conductor layers are serving as the control electrode and constitute the word lines WL7. When the conductor layers are formed of polysilicon, the silicon oxide film may be formed by oxidizing the conductor layers. Instead of the ONO film, the insulation film (inter-electrode insulation films), the polysilicon (charge accumulation electrode) and the insulation film (gate insulation film) may be formed.

The nonvolatile semiconductor storage device of the present invention is not limited to a device which takes, as memory elements, memory cell transistors using an ONO film. For instance, the nonvolatile semiconductor storage device may also be a device using a phase-transition memory cell that stores data by use of a phenomenon of a film, such as chalcogenide (GeSbTe), which exhibits different electrical resistance according to a difference in the phase of the film; namely, according to a crystalline phase or an amorphous phase. Alternatively, a device using, as memory elements, storage elements employing a ferroelectric thin film material are also applicable.

Figure 3:
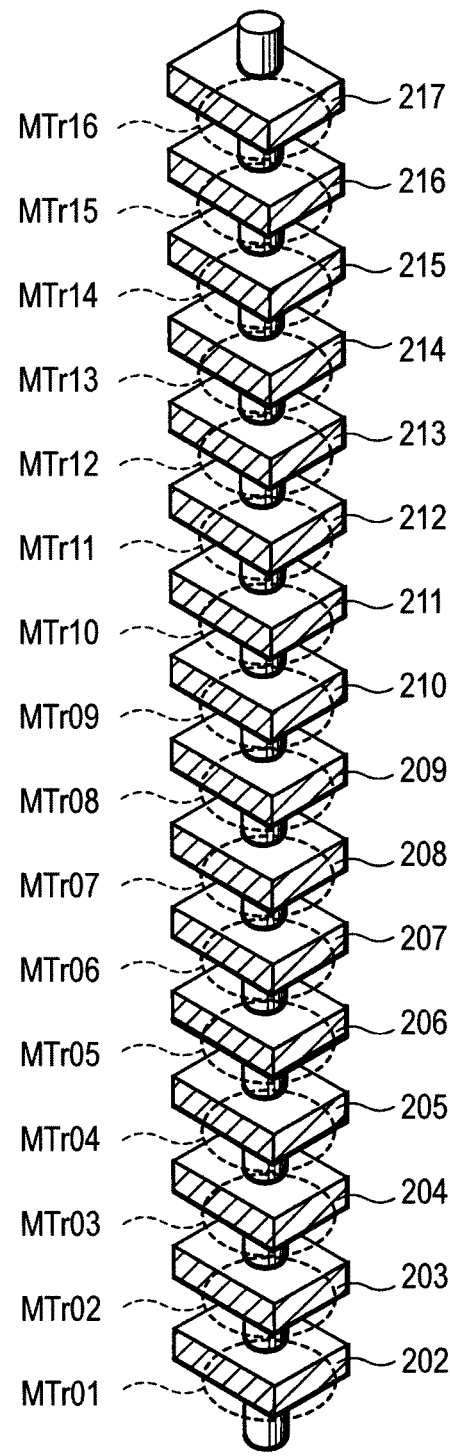
FIG. 3 is a diagrammatic view of one memory string according to the embodiment.

FIG. 3 is a schematic block diagram of a semiconductor pillar and charge accumulation films on an area A and conductor layers located around the area A which are shown in FIG. 2. The insulation layers are omitted from FIG. 3. A group of memory elements formed of a single semiconductor pillar are referred to as a "memory string." FIG. 3 shows a memory string made up of 16 memory cell transistors MTr01 to MTr16. Each of the memory cell transistors is formed at an intersection point of the semiconductor pillar and the conductor layer. An "intersection point" refers to an area where the semiconductor pillar adjoins the conductor layer through the charge accumulation films. Although the conductor layer is expressed by an essentially-columnar shape, the conductor layer is not limited to the columnar shape. For instance, a cylindrical hole may also be formed in the center of the semiconductor pillar, and the hole may also be embedded with an insulating material. Further, the semiconductor pillar may also assume a prismatic shape rather than a columnar shape.

Figure 4:
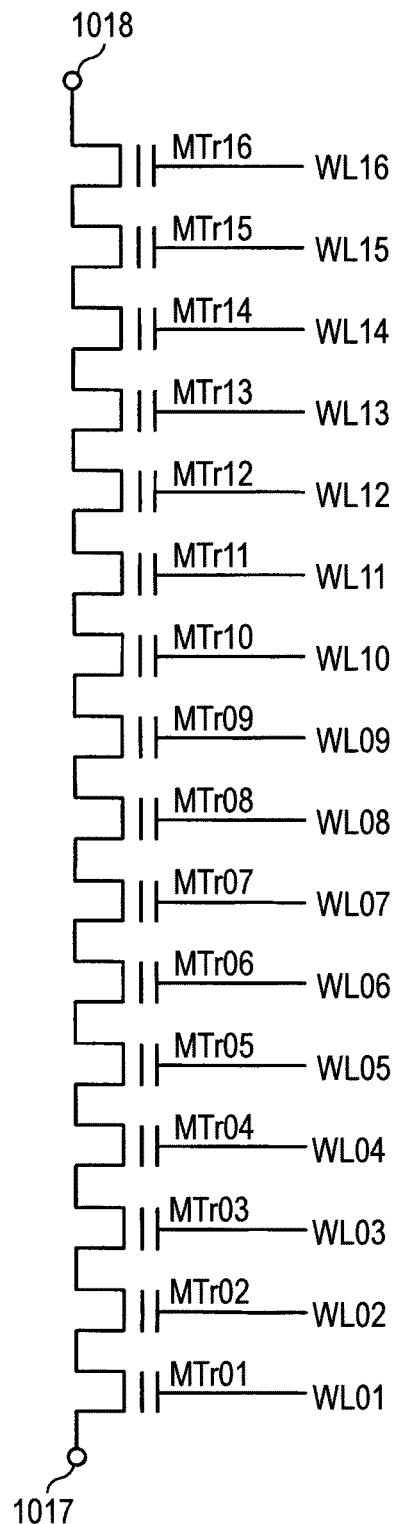
FIG. 4 is a circuit diagram equivalent to the memory string according to the embodiment.

FIG. 4 shows a circuit diagram equivalent to the memory string shown in FIG. 3. As shown in FIG. 4, the memory cell transistors MTr01 to MTr16 are connected in series by means of semiconductor pillar, and control gates of the memory cell transistors are connected to respective word lines WL01 to WL16. The word lines WL01 to WL16 correspond to the conductor layers 202 to 217. Select gate transistors are connected to terminals 1017 and 1018. A select gate transistor connected to the terminal 1017 is connected to the source-side select gate drive circuit 4, and the select gate transistor connected to the terminal 1018 is connected to the drain-side select gate drive circuit 5.

Figure 5:
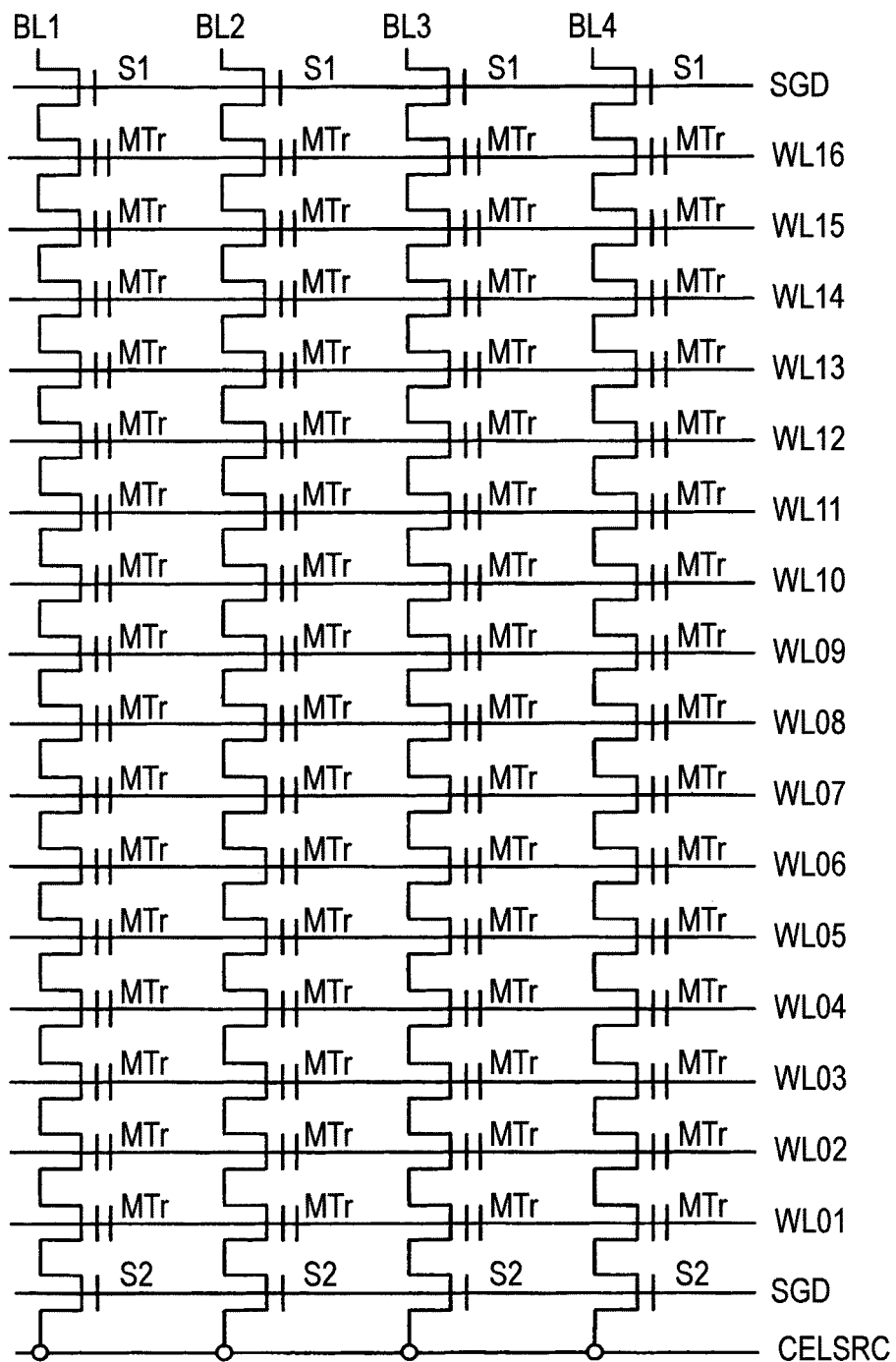
FIG. 5 is a circuit diagram equivalent to NAND flash memory according to the embodiment.

FIG. 5 shows a circuit equivalent to the select gate transistor connected to a common source CELSRC formed in a substrate 201, the memory string made up of the semiconductor pillars 301 to 304, and the select gate transistor that is formed on an upper surface of an insulation layer 233 and that is connected to bit lines BL1 to BL4. It is clear from FIG. 5 that the nonvolatile semiconductor storage device of the embodiment can operate as a NAND flash memory device.

The inventors of the present invention has found that a unique technical effect is yielded by changing one or a plurality of insulation layer (s) or/and conductor layer (s) from the other insulation layers or/and the conductor layers in terms of physical properties, such as a material and the thickness of a layer. Explanations are hereunder provided to the special technical effect by reference to FIG. 2.

In FIG. 2, the conductor layers 202, 203, 204, 205, 206, 207, 208, 209, 210, 211, 212, 213, 214, 215, 216, and 217 are formed of; for instance, polysilicon having a thickness of about 30 nanometers. Another material includes p-type amorphous silicon, a silicide compound, and the like. In order to address an increase in electrical resistance attributable to an increase in the area of the conductor layers (the length of a signal propagating path) resulting from an increase in the size of the nonvolatile semiconductor storage device, conductor layers having metal layers of high conductivity may also be formed. When the memory elements are memory cell transistors, the conductor layers constitute word lines of the memory cell transistors. In association with simplification of processes, the conductor layers may simultaneously form control gates of the memory cell transistors in addition to forming the word lines. Therefore, physical characteristics of the conductor layers, such as a thickness and a material, can affect the characteristics of the memory elements. From this viewpoint, it is preferable that the conductor layers 202, 203, 204, 205, 206, 207, 208, 209, 210, 211, 212, 213, 214, 215, 216, and 217 should exhibit the same physical characteristic.

For instance, it is preferable that the conductor layers should be formed of; for example, the same material and have the same thickness.

However, use of the same material for the conductor layers and forming the conductor layers to the same thickness are not indispensable. For example, so long as materials and the thickness of conductor layers are adjusted in such a way that the memory elements have the same characteristic, different materials and a different thickness can be adopted. Further, all insulation layers do not have the same thickness by process variation. The process variation usually falls within a range of about ±10%. All elements formed in the conductor layers may not be limited to memory elements. As will be described in connection with another embodiment, elements that act in a different manner as do the memory elements may also be fabricated by changing the material and thickness of the conductor layers.

The insulation layers 218, 219, 220, 221, 222, 223, 224, 225, 226, 227, 228, 229, 230, 231, 232, and 233 are layers having the same thickness of the conductor layers; for instance, a thickness of 30 nanometers. For reasons of process variation, the insulation layers are not always formed to the same thickness. Process variation usually falls within a range of about ±10%. The insulation layer 223 that is the top layer may also be different, as having a protective surface, from the insulation layers 218, 219, 220, 221, 222, 223, 224, 226, 227, 228, 229, 230, 231, and 232 in terms of a material and a structure. For instance, the thickness of the insulation layer 223 may also become great. $SiO_2$, AlOx, SiN, SiON, and the like, are used as a material for the insulation layer 223.

In the embodiment, the insulation layer 225 is configured so as to be different, in terms of a material, from the other insulation layers 218, 219, 220, 221, 222, 223, 224, 226, 227, 228, 229, 230, 231, 232, and 233. The insulation layer 225 is hereinafter called a "marker insulation layer 225."

In an observation using SEM (Scanning Electron Microscope) or TEM (Transmission Electron Microscope), the marker insulation layer 225 and the other insulation layers 218 . . . can be distinguished from each other by a contrast induced by a difference between electronic waves to be reflected or transmit. They can also be distinguished from each other in a detailed manner by XPS (X-ray photoelectron spectroscopy), EDX (Energy Dispersive X-ray Spectroscopy), AES (Auger Electron Spectroscopy), RBS (Rutherford Backscattering Spectrometry), or SIMS (Secondary Ion Mass Spectrometry). The marker insulation layer 225 and the conductor layers 202, 203, 204, 205, 206, 207, 208, 209, 210, 211, 212, 213, 214, 215, 216, and 217 may also be distinguished from each other by the foregoing method.

For instance, the insulation layer may also be embodied as a silicon oxide film, and the marker insulation layer may also be embodied as a silicon nitride film or a Low-k film typified by an SiOC-based or SiOCH-based porous low dielectric film formed by doping $Al_2O_3$ or $SiO_2$ with carbon.

In FIG. 2, the marker insulation film 225 is situated at an approximately-intermediate position in the multilayer consisting of the insulation layers and the conductor layers. As a matter of course, the position of the marker insulation layer 225 is not limited to the intermediate position. The marker insulation film may also be formed at a position of other insulation layers. For instance, the insulation film, the marker insulation film, and the insulation film may also be stacked in sequence from below or above. In particular, when an insulation film having high electron trapping property is used as the marker insulation layer 225, variations in a characteristic of the memory elements formed in the conductor layers can be prevented by sandwiching the marker insulation layer 225 with insulation films of low electron trapping property.

A material of one insulation layer is replaced with a material of another insulation layer, or a material of one conductor layer is replaced with a material of another conductor layer, whereby an insulation layer or a conductor layer whose material has been replaced with a material of another insulation layer or another conductor layer can be readily specified by observing a cross section of a multilayer through use of TEM or SEM or, if necessary, a combination of TEM or SEM with EDX or others. When a plurality of layers is stacked, it is difficult to observe the entirety of a multilayered section at a glance by TEM or SEM because of a limitation on a scope. For this reason, when observing an insulation layer where dielectric breakdown has arisen, it is difficult to accurately count the number of layers with a view toward specifying whether the thus-observed layer is the top layer or determining which layer from the bottom. However, as in the embodiment, so long as there is a layer that can be distinguished from another insulation layer or conductor layer, the number of layers is counted with reference to the layer that can be distinguished, whereby the number of the layer occurred dielectric breakdown in the entire multilayer can be readily specified. The insulation layer or the conductor layer that has been changed from other insulation layers or conductor layers in terms of a physical characteristic; for instance, a material, can be used as a "marker layer."

Figure 6:
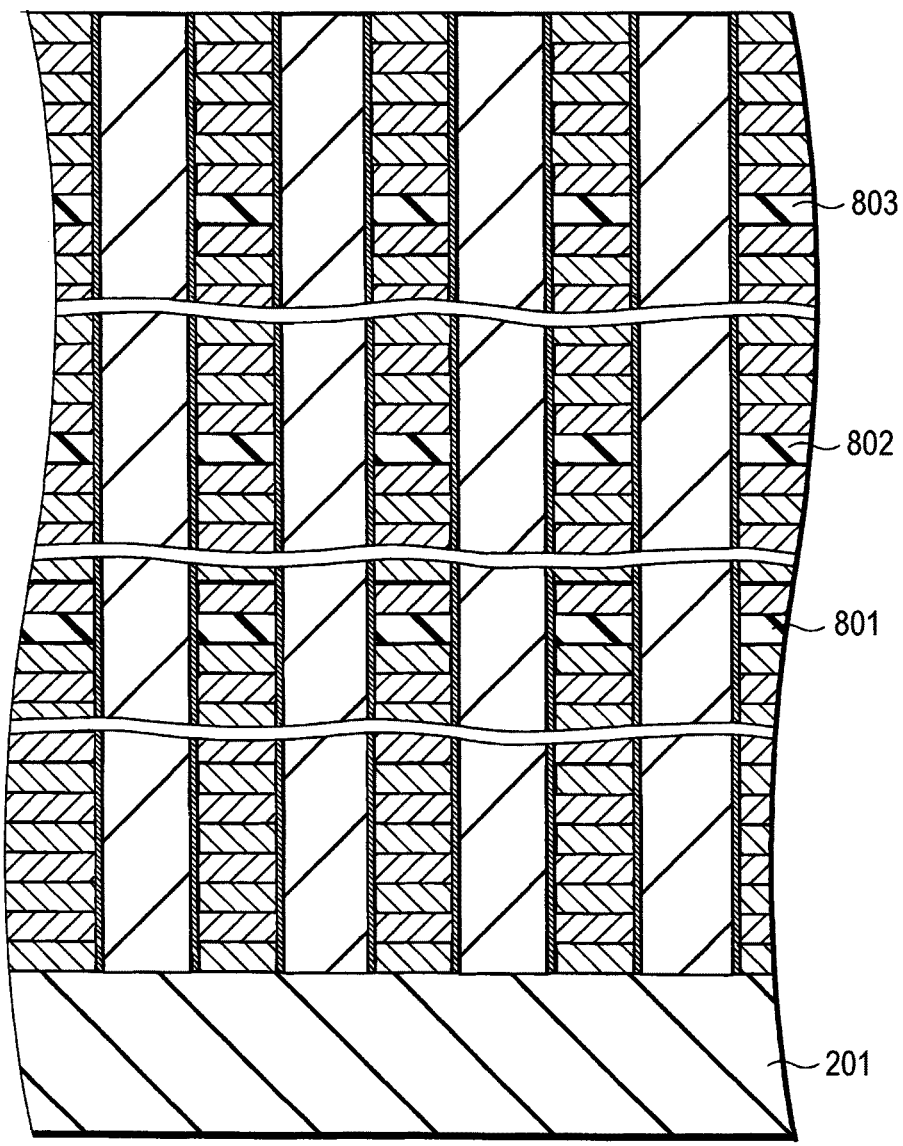
FIG. 6 is a view showing a state where conductor layers and insulation layers are alternately stacked in the nonvolatile semiconductor storage device according to the embodiment and where semiconductor pillars are formed on memory plug holes.

Moreover, a plurality of marker layers may be disposed in the multilayer. FIG. 6 shows an example where a plurality of marker layers 801, 802, and 803 are disposed in a multilayer on the substrate layer 201. As mentioned above, by disposing a plurality of marker layers, the etching of a plurality of memory plug holes can be performed with a high aspect ratio as will be described later. A marker layer may also periodically appear in the multilayer at, for example, every 17 layers. So long as the marker layer is caused to periodically appear, the number of layers is first counted by paying attention to a marker layer when the layer occurred failure is observed by TEM or SEM. Subsequently, the number of a layer where a failure has arisen is counted with reference to the finally-counted marker layer, whereby the number of the layer including a failure in the entire multilayer can be readily determined. As a matter of course, since the essential requirement for the marker layer is to enable location of the number of another layer in the entire multilayer, the marker layer does not need to appear at a rigid period.

Figure 7:
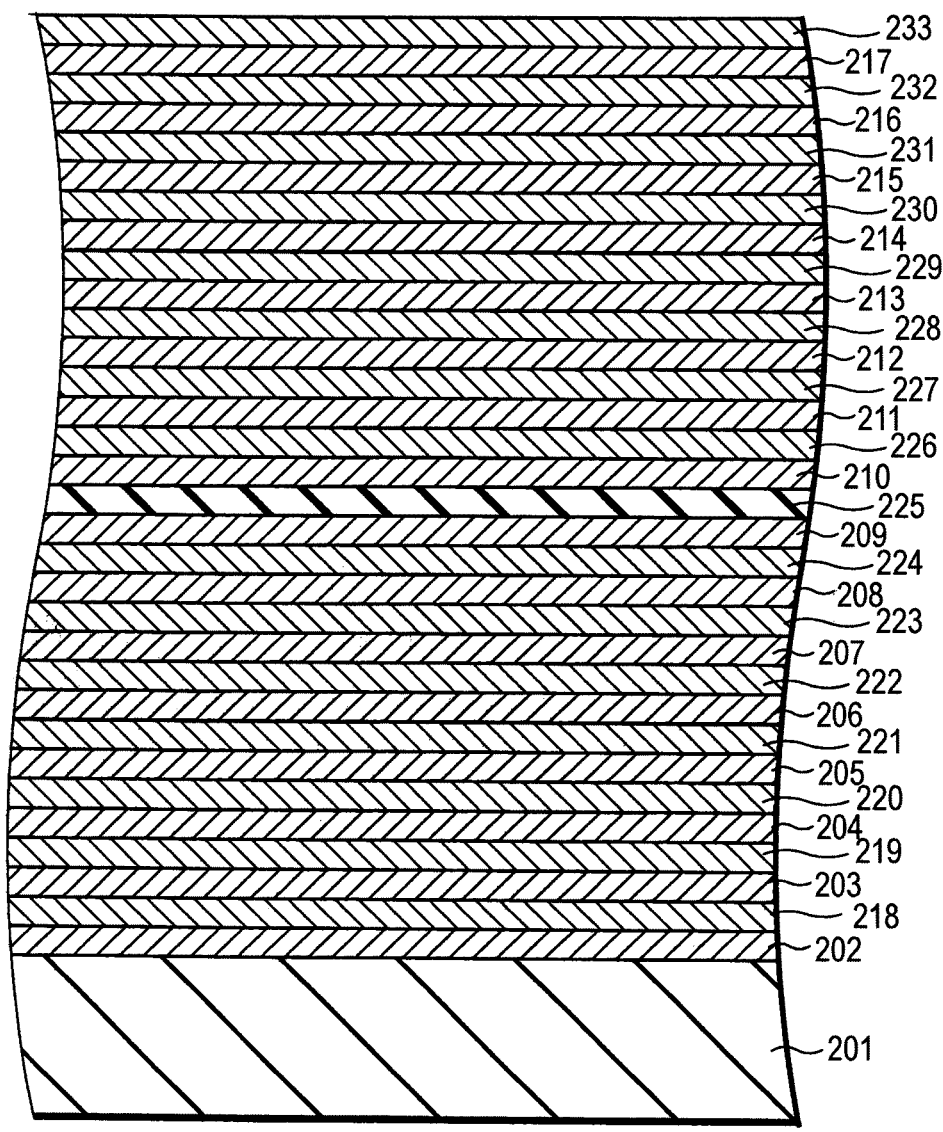
FIG. 7 is a view for explaining formation of memory plug holes according to the embodiment.

Processes for fabricating a nonvolatile semiconductor storage device whose cross section is shown in FIG. 2 will now be described by reference to FIGS. 7 through 12. First, as shown in FIG. 7, conductor layers and insulation layers are stacked one on top of the other on the substrate layer 201. The layer to be first stacked may also be an insulation layer rather than a conductor layer. After stacking of the conductor layer 209, the marker layer 225 is stacked. Subsequently, the conductor layer 210 and the insulation layer 226 are sequentially stacked, and the insulation layer 233 is finally stacked. CVD (Chemical Vapor Deposition), ALD (Atomic Layer Deposition), or sputtering can also be used for stacking these layers.

Figure 8:
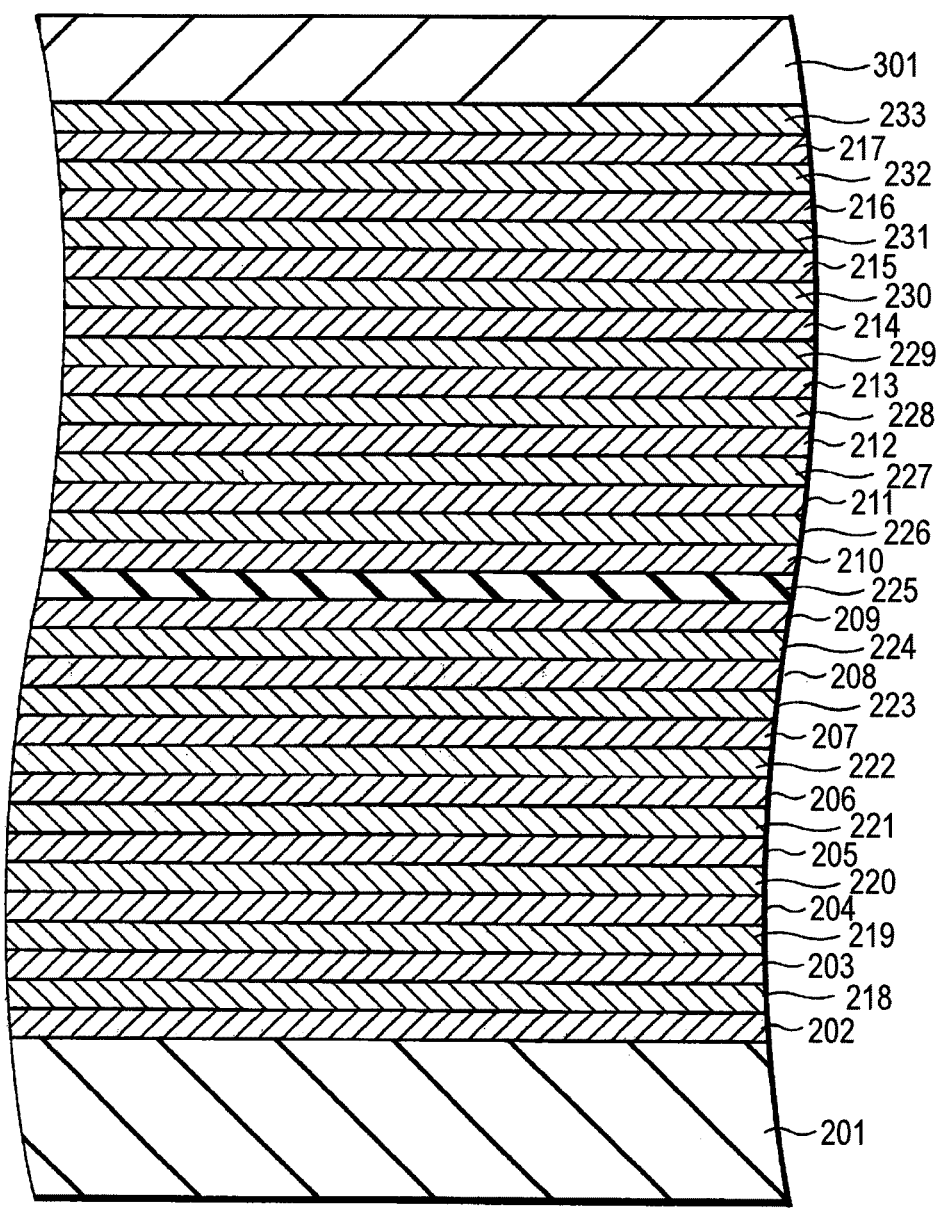
FIG. 8 is a view for explaining formation of memory plug holes according to the embodiment.

As shown in FIG. 8, in order to create memory plug holes, photoresist 301 is applied on the insulation layer 233 that is the top layer. In connection with photoresist, positive photoresist and negative photoresist are known. Positive photoresist usually enables enhancement of a resolution, whereas negative photoresist is known to exhibit superior adhesion. The memory plug holes created in the embodiment exhibit a high aspect ratio. From this viewpoint, use of negative photoresist is preferable. Etching can also be facilitated by forming, on the insulation layer 233, a hard mask layer whose etching selectivity differs from etching selectivity of the conductor layer, that of insulation layer, and that of the marker insulation layer.

Figure 9:
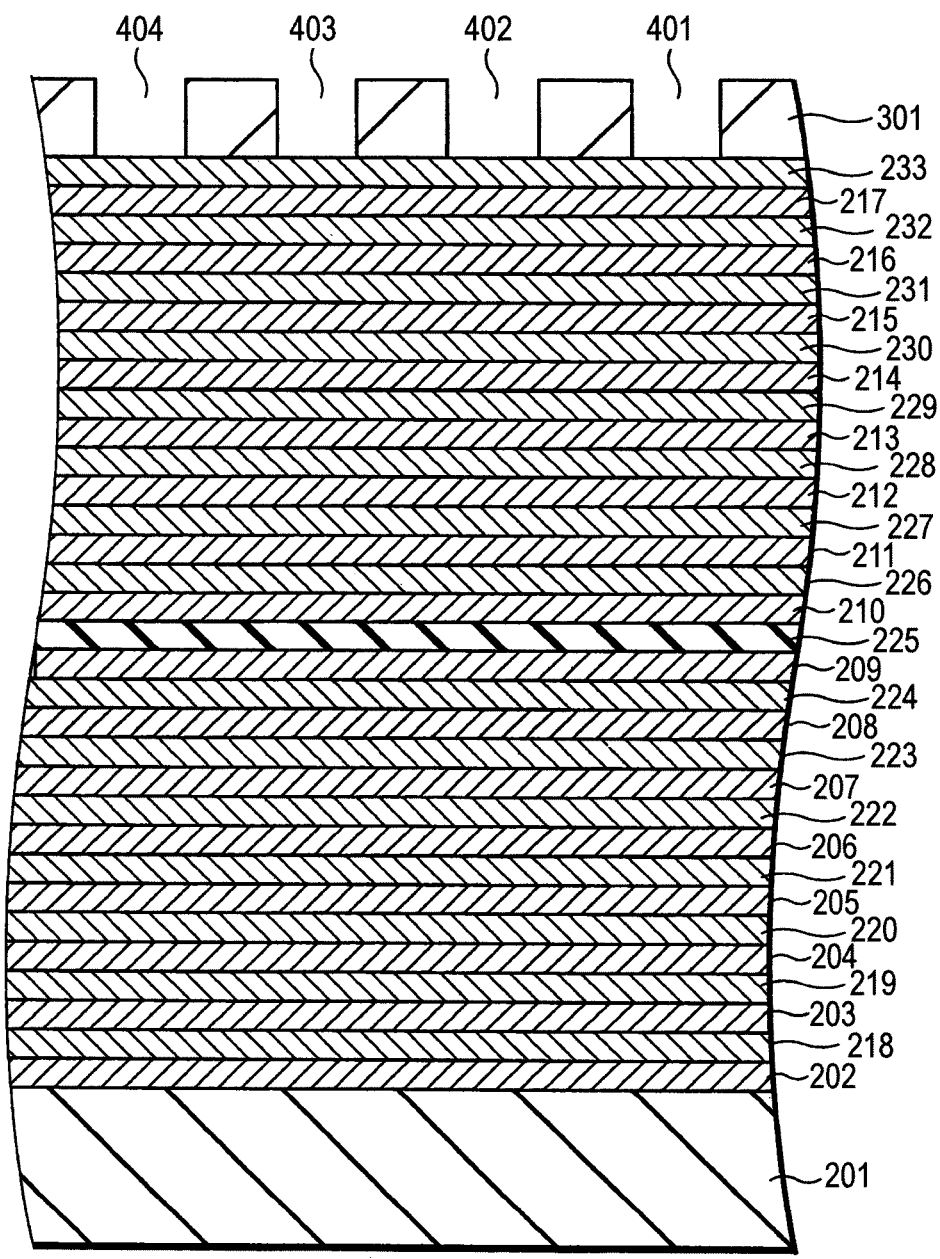
FIG. 9 is a view for explaining formation of memory plug holes according to the embodiment.

As shown in FIG. 9, patterns 401, 402, 403, and 404 for memory plug holes are created by performing photolithography. Etching [e.g., RIE (Reactive Ion Etching)] is performed while the photoresist 301 is taken as a mask (etching is called "first etching process").

Figure 10:
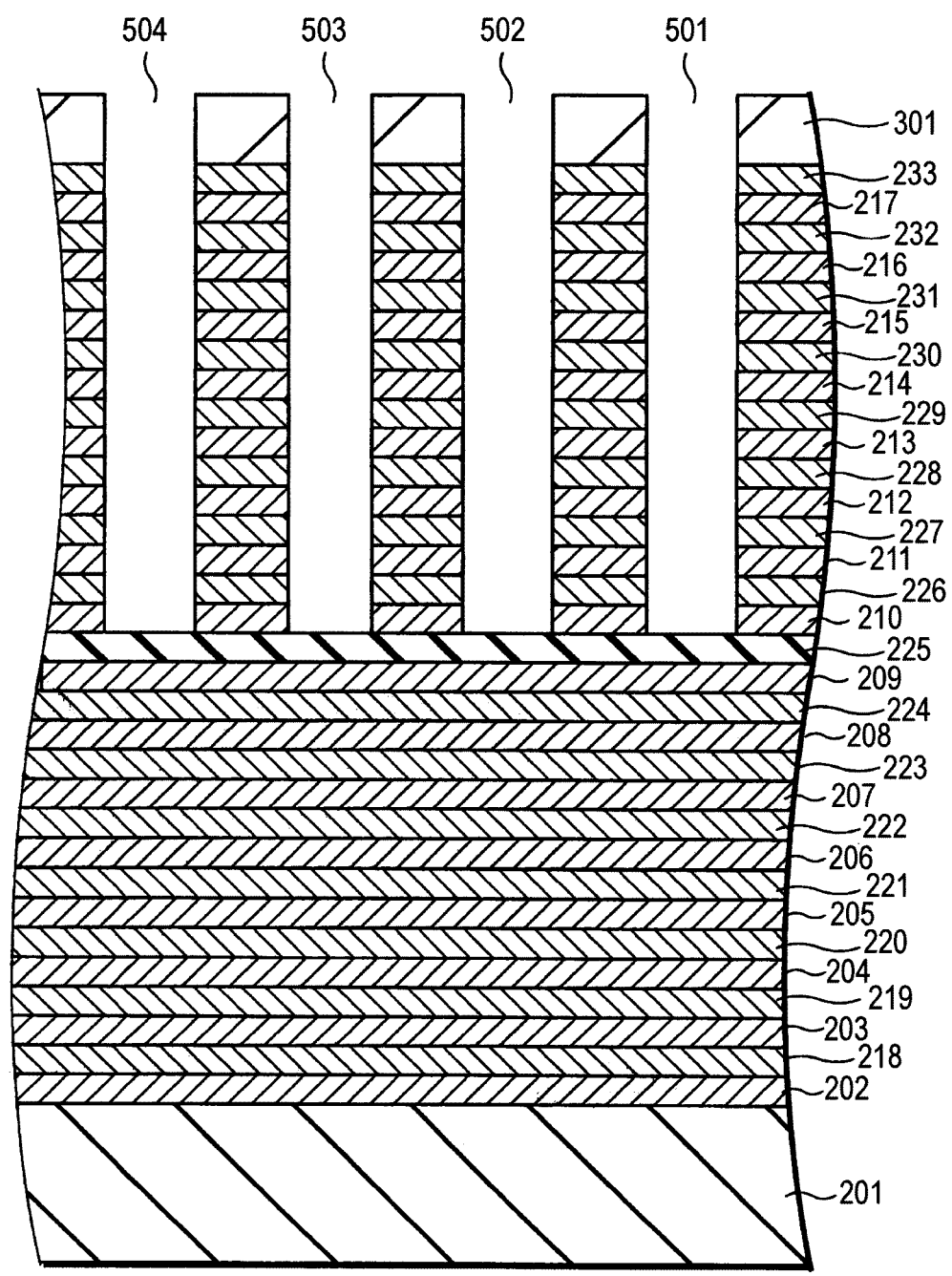
FIG. 10 is a view for explaining formation of memory plug holes according to the embodiment.

An etching selectivity is varied in accordance with physical characteristic of a material, or the like. By adjusting the etching selectivity of the marker insulation layer 225 with respect to the etching selectivity of the conductor layers 202, 203, 204, 205, 206, 207, 208, 209, 210, 211, 212, 213, 214, 215, 216, and 217 and the insulation layers 218, 219, 220, 221, 222, 223, 224, 226, 227, 228, 229, 230, 231, 232, and 233, the first etching process can be stopped while a bottom of the plurality of memory plug holes remain reached at the insulation layer 225. Consequently, as shown in FIG. 10, memory plug holes 501, 502, 503, and 504 are caused to reach the insulation layer 225, so that the depths of the memory plug holes can be made uniform. Since the essential requirement is to etch about half the number of stacked layers rather than to cause the memory plug holes to reach the substrate layer 201 at a time, processing becomes easy. Consequently, it becomes possible to uniform depths and suppress variations in the diameters of the memory plug holes having high aspect ratios. Therefore, the risk of penetration of the bottom conductor layer 202 and etching of the substrate layer 201 is also eliminated.

FIG. 10 shows wall surfaces of the memory plug holes in the vertical direction. In reality, in addition to the case where the wall surfaces become perpendicular, there are cases where the wall surfaces assume a tapered surface, a reverse-tapered surface, a barrel shape, or an irregular shape.

Figure 11:
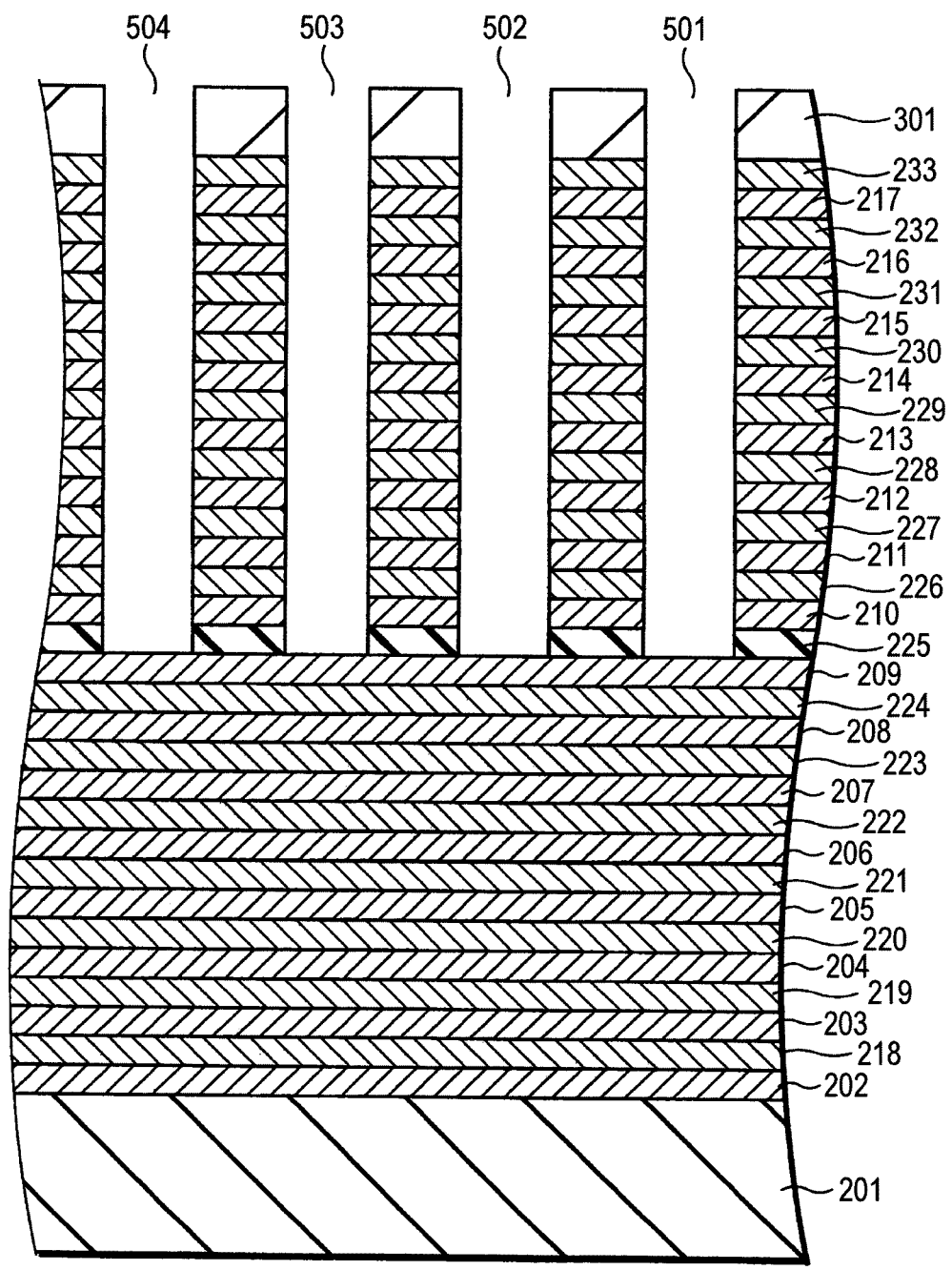
FIG. 11 is a view for explaining formation of memory plug holes according to the embodiment.

Next, the second etching process is performed by changing the type of ions used for etching, thereby causing the plurality of memory plug holes 501, 502, 503, and 504 to penetrate through the marker insulation layer 225 and reach the conductor layer 209 as shown in FIG. 11.

Figure 12:
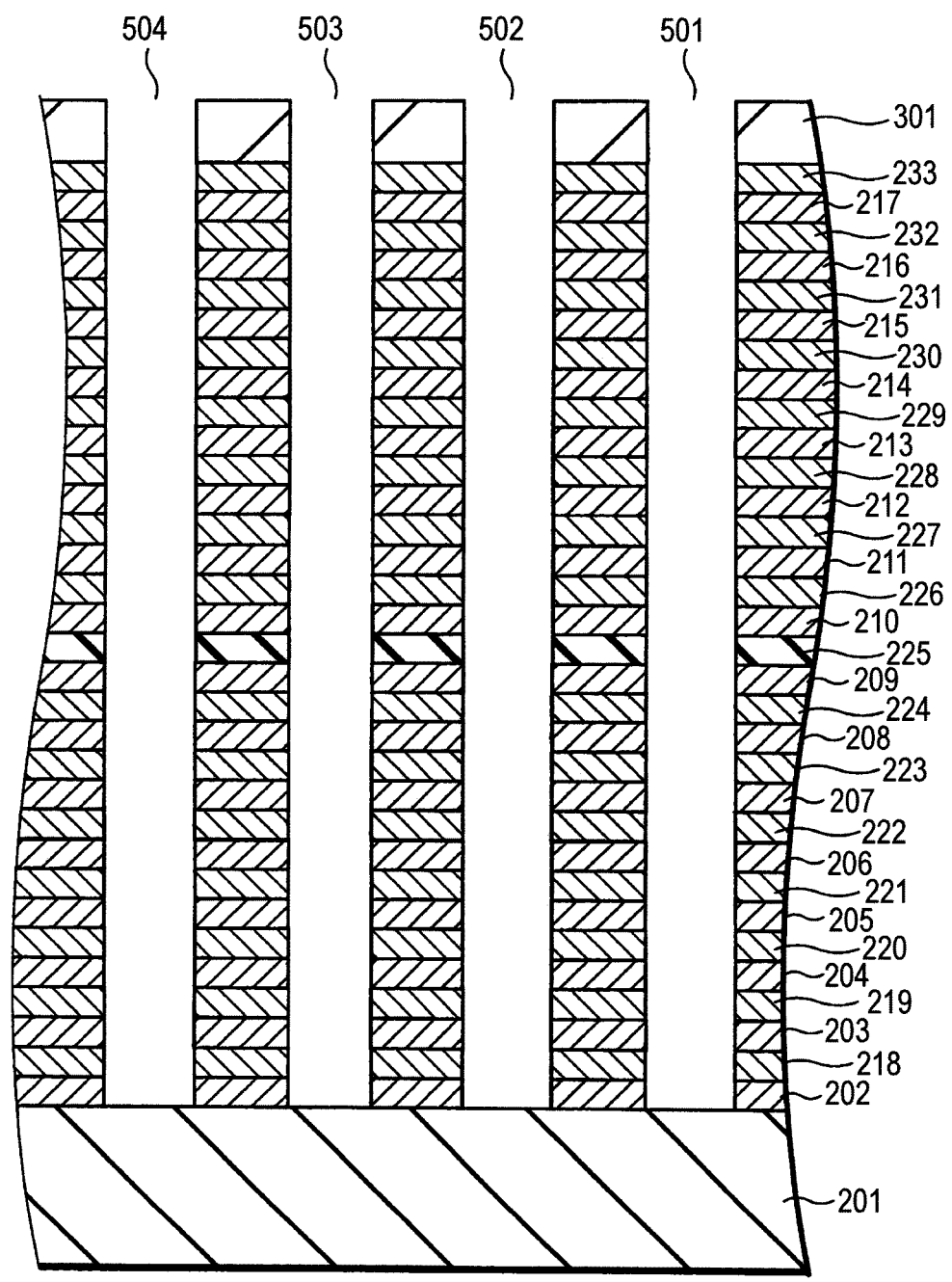
FIG. 12 is a view for explaining formation of memory plug holes according to the embodiment.

Next, by changing of, for example, the type of ions back to that of the first etching process, and the third etching process is performed, thereby causing the plurality of memory plug holes 501, 502, 503, and 504 to reach the substrate layer 201 as shown in FIG. 12. So long as the conductor layer 202 and the substrate layer 201 are made different from each other in terms of selectivity, corrosion of the substrate 201 caused by third etching can be prevented.

In the first etching process and the third etching process, the memory plug holes 501, 502, 503, and 504 located above the insulation layer 225 and those located below the insulation layer 225 may differ from each other in terms of a shape.

Even when a plurality of marker insulation layers are disposed as shown in FIG. 6, the multilayer can be manufactured by repetition of the first etching process (third etching process) and the second etching process. Moreover, the number of layers to be etched by one operation can be reduced to one-half or less, and hence processing is facilitated further.

Example processes for fabricating a memory element performed after formation of the memory plug holes to the substrate layer 201 are as follows. A control gate insulation film, a charge accumulation layer, and a gate insulation film are formed, in order to from the conductor layer, on the surface of the conductor layer exposed by the memory plug holes. For instance, when a conductor layer is formed of polysilicon, areas exposed through the memory plug holes are thermally oxidized, to thus form a control gate insulation film. Alternatively, a silicon oxide film is formed over entire interior surfaces of the memory plug holes. Next, a charge accumulation layer; for instance, a layer formed of a nitride film, are formed, to thus generate a layer from an oxide film.

Through the example processes for manufacturing a memory layer and a semiconductor pillar, a silicon oxide film, a silicon nitride film, and a silicon oxide film are sequentially deposited on interior surfaces of the memory plug holes, thereby generating a so-called ONO film. The silicon nitride film in the ONO film acts as a charge accumulation layer of the memory cell transistors. Semiconductor pillars which have columnar shape are formed by depositing an amorphous silicon film in memory plug holes. A polycrystalline silicon film may also be subjected to epitaxial growth instead of deposition of the amorphous silicon layer in memory plug holes, to thus form a polycrystalline silicon layer.

As described above, by disposing a marker layer, the position of a layer, where a failure has arisen, in the entirety can be located with reference to the marker layer. Further, depths of a plurality of memory plug holes exhibiting a high aspect ratio can be uniformed.

(Second Embodiment)

In the first embodiment, the insulation layer (conductor layer) having a material different from the other insulation layers (conductor layers) are used as the marker layer. In a second embodiment, the insulation or conductor layer having the thickness larger than that of the other insulation or conductor layers are used as a marker layer. For instance, an insulation layer (or a conductor layer) that is to become a marker layer is made thinner or thicker than the other insulation layers (or the other conductor layers). In the embodiment, the insulation layer (or the conductor layer) that is to act as a marker layer may be formed of a material different from the other insulation layers (or the conductor layers). However, in consideration of the number of processes through which the conductor layers and the insulation layers are stacked, the insulation layer (or the conductor layer) that is to serve as a marker layer may also be formed to a different thickness from the same material as that used for the other insulation layer (or the other conductor layers).

Figure 13:
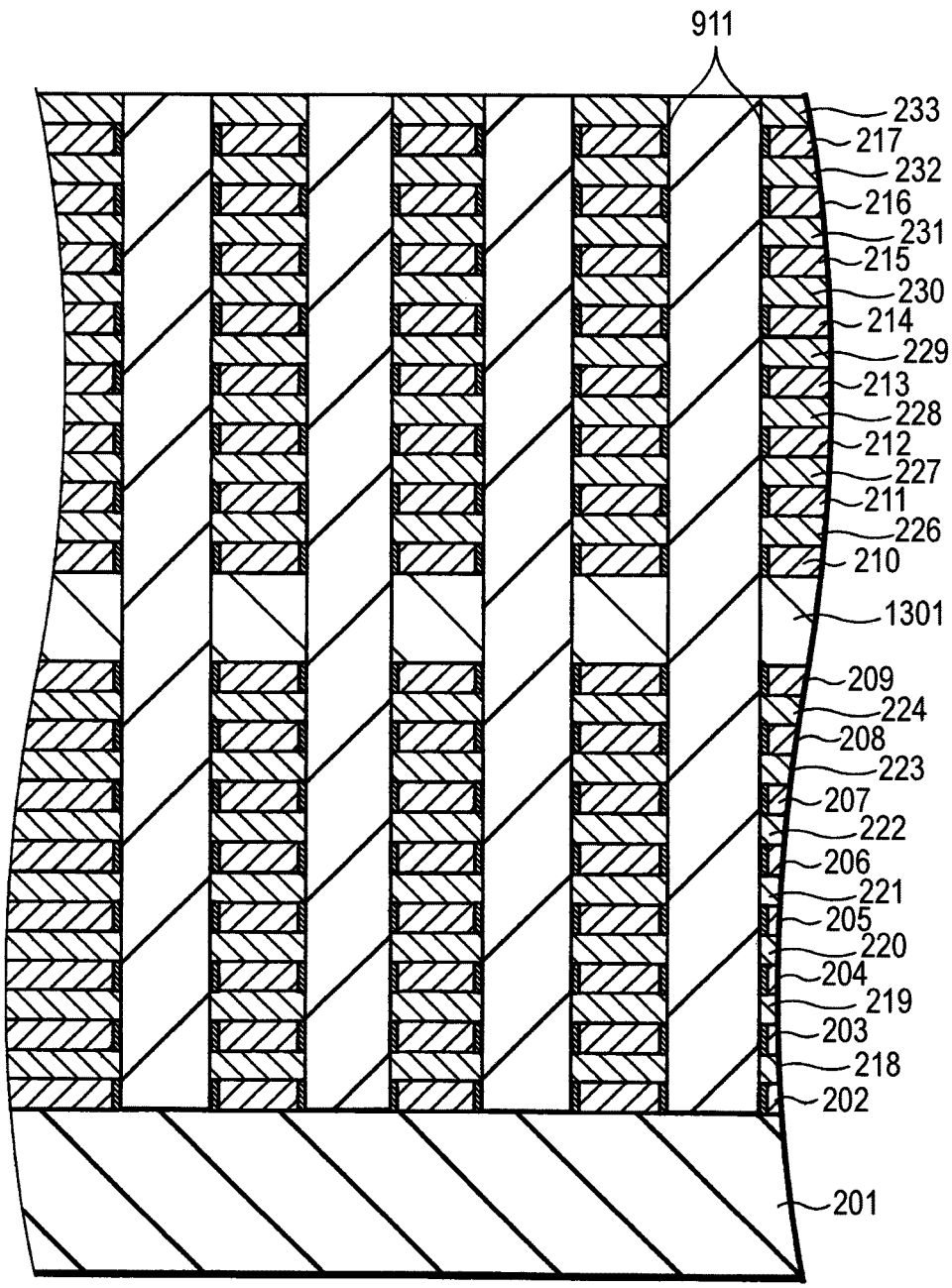
FIG. 13 is a view showing a state where conductor layers and insulation layers are alternately stacked in the nonvolatile semiconductor storage device according to the embodiment and where semiconductor pillars are formed on memory plug holes.

As in FIG. 2, FIG. 13 shows that the conductor layers 202, 203, 204, 205, 206, 207, 208, 209, 210, 211, 212, 213, 214, 215, 216, and 217 and the insulation layers 218, 219, 220, 221, 222, 223, 224, 1301, 226, 227, 228, 229, 230, 231, 232, and 233 are stacked on the substrate layer 201 one on top of the other. In the embodiment, the insulation layer 1301 is made thicker than the other insulation layers. In the second embodiment, the conductor layers are retreated from the memory plug hole by the isotropic etching or the like, and charge accumulation films 911 are formed on the retreated portions of the conductor layers.

Variations can arise in the thickness of the insulation film for reasons of process variation as mentioned previously. In this regard, the essential requirement for the thickness of the insulation layer 1301 is to be of the order of magnitude at which the insulation layer acts as a marker layer even while including process variation. Specifically, the essential requirement for the insulation layer 1301 is to be different in thickness to such an extent that the insulation layer 1301 can be recognized as being different from the other insulation layers 218 . . . . For instance, the insulation layer 1301 may also be greater or smaller in thickness than the other insulation layers.

Figure 14:
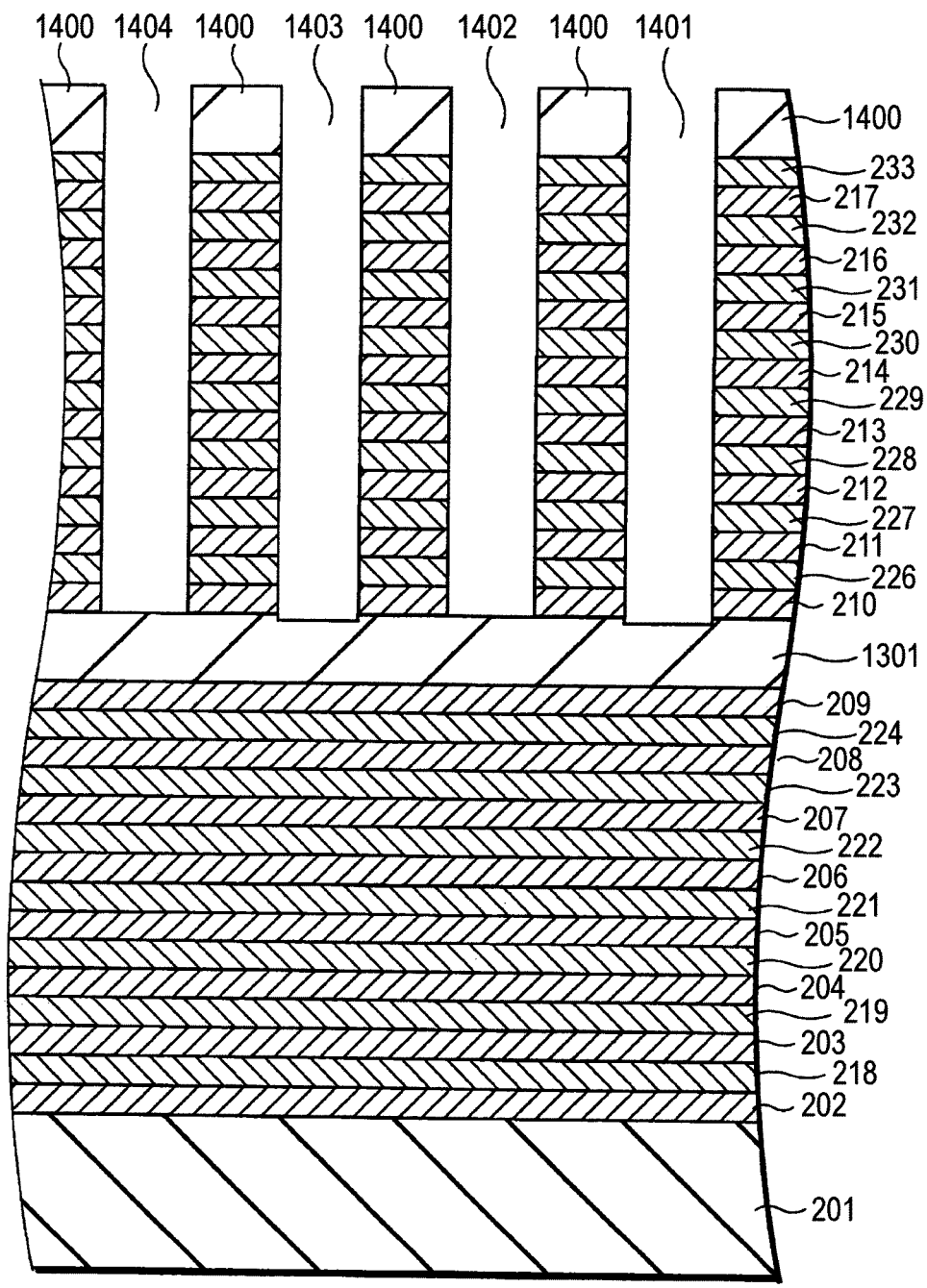
FIG. 14 is a view for explaining formation of memory plug holes according to the embodiment.

Manufacturing processes of the embodiment will now be described. Photoresist 1400 is applied, in the same manner as in FIG. 6, over the multilayer consisting of the conductor layers and the insulation layers that are alternately deposited on the substrate layer 201, and the substrate is subjected to photolithography. Etching (first-phase etching) is carried out by use of the thus-acquired mask, thereby opening memory plug holes 1401, 1402, 1403, and 1404 that reach the insulation layer 1301 as shown in FIG. 14. In the embodiment, even when the insulation layer 1301 is formed of the same material as that of the other insulation layers or has the same selectivity as that of the other insulation layers, since the insulation layer 1301 is made thicker than the other insulation layers, the etching depths of the memory plug holes can be controlled within range of the insulation layer 1301.

Figure 15:
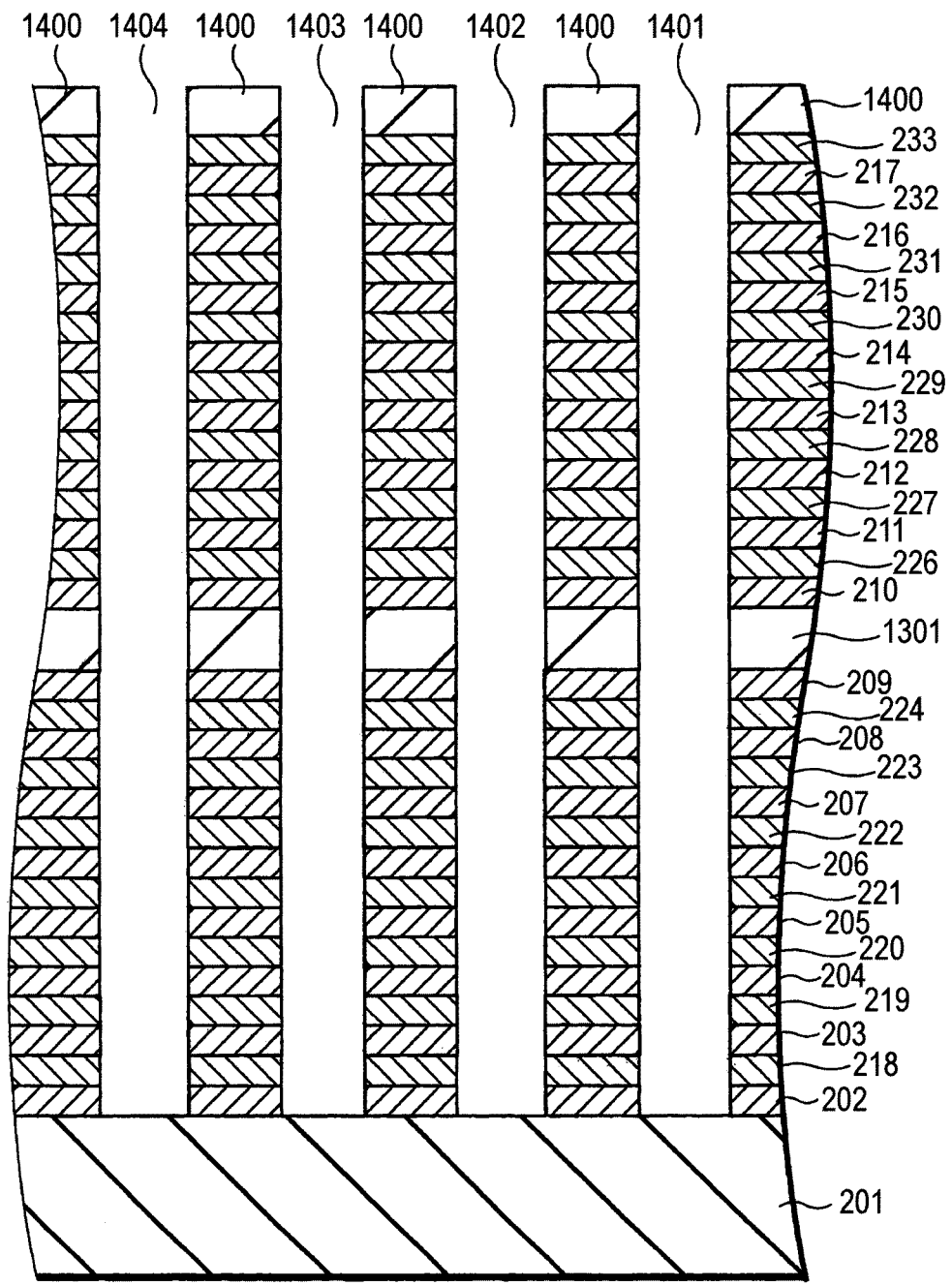
FIG. 15 is a view for explaining formation of memory plug holes according to the embodiment.

First, processing is performed by decreasing an etching rate for the insulation layers and by increasing an etching rate for the conductor layers before a bottom of the memory plug holes 1401, 1402, 1403, and 1404 reach the insulation layer 1301 (a first etching rate). Since the insulation layer 1301 is thicker than the other insulation layers, not all of the memory plug holes penetrate the insulation layer 1301. Next, the insulation layer 1301 is processed by increasing the etching rate for the insulation layers and by decreasing the etching rate for the conductor layers (a second etching rate). As shown in FIG. 15, the bottom of the memory plug holes 1401, 1402, 1403, and 1404 are caused to reach the substrate layer 201.

Further, even when the etching of the memory plug holes reach the middle of the insulation layer 1301 by the overetching, the depths of the memory plug holes can be made uniform at the conductor layer 209 by adding the etching process of the second etching rate for the insulation layer 1301. After penetration of the insulation film 1301 at the second etching rate, the etching rate may also be changed back to the first etching rate.

As shown in FIG. 6 in connection with the first embodiment, a plurality of marker layers may also be disposed in the second embodiment. In this case, the etching rate is adjusted every time the memory plug holes reach the marker layer during the course of formation of the memory plug holes, thereby achieving matched progress of etching.

In addition to the advantages of the first embodiment, the embodiment also enables to reduce the number of processes to form the marker layers of different materials, by changing the thickness of the marker layers.

As described above, according to the embodiment, stacking processes can be simplified.

(Third Embodiment)

The second embodiment has described the case where the insulation layer serving as a marker layer is made greater in thickness than the other insulation layers. A third embodiment describes a case where a conductor layer is taken as a marker layer and where the marker layer is made greater in thickness than the other conductor layers. Further, the conductor layer serving as a marker layer may also be different in material from the other conductor layers.

For instance, the conductor layers may be formed of metal, such as Al and Cu, and the marker layer may be formed of a compound consisting of polysilicon and silicide.

Manufacturing processes of the embodiment will now be described. As is seen from FIG. 16, the conductor layers 202, 203, 204, 205, 206, 207, 208, 209, 1601, 210, 211, 212, 213, 214, 215, 216, and 217 and insulation layers 218, 219, 220, 221, 222, 223, 224, 1602, 1603, 226, 227, 228, 229, 230, 231, 232 and 233 are stacked one on top of the other on the substrate layer 201. In the embodiment, the conductor layer 1601 is made thicker than the other conductor layers. Further, a material for the conductor layer 1601 may also be different from a material for the other conductor layers. In this case, the conductor layer 1601 may be arranged so as to differ from the other conductor layers and insulation layers in terms of etching selectivity. Specifically, the essential requirement for the conductor layer 1601 is to differ in thickness to such an extent that the conductor layer 1601 can be distinguished as being different from the other conductor layers 202 . . . . The insulation layers 1602 and 1603 are provided to isolate the marker layer 1601 that is the conductor layer from the conductor layers 209, 210. A material for the insulation layers 1602 and 1603 may be same with, or different from a material for the other insulation layers. Also, the thickness of the insulation layers 1602 and 1603 may be same with, or different from the thickness of the other insulation layers. For example, by forming the conductor layer 1601 to surround the semiconductor pillar through an insulating film, a transistor can be formed.

Figure 16:
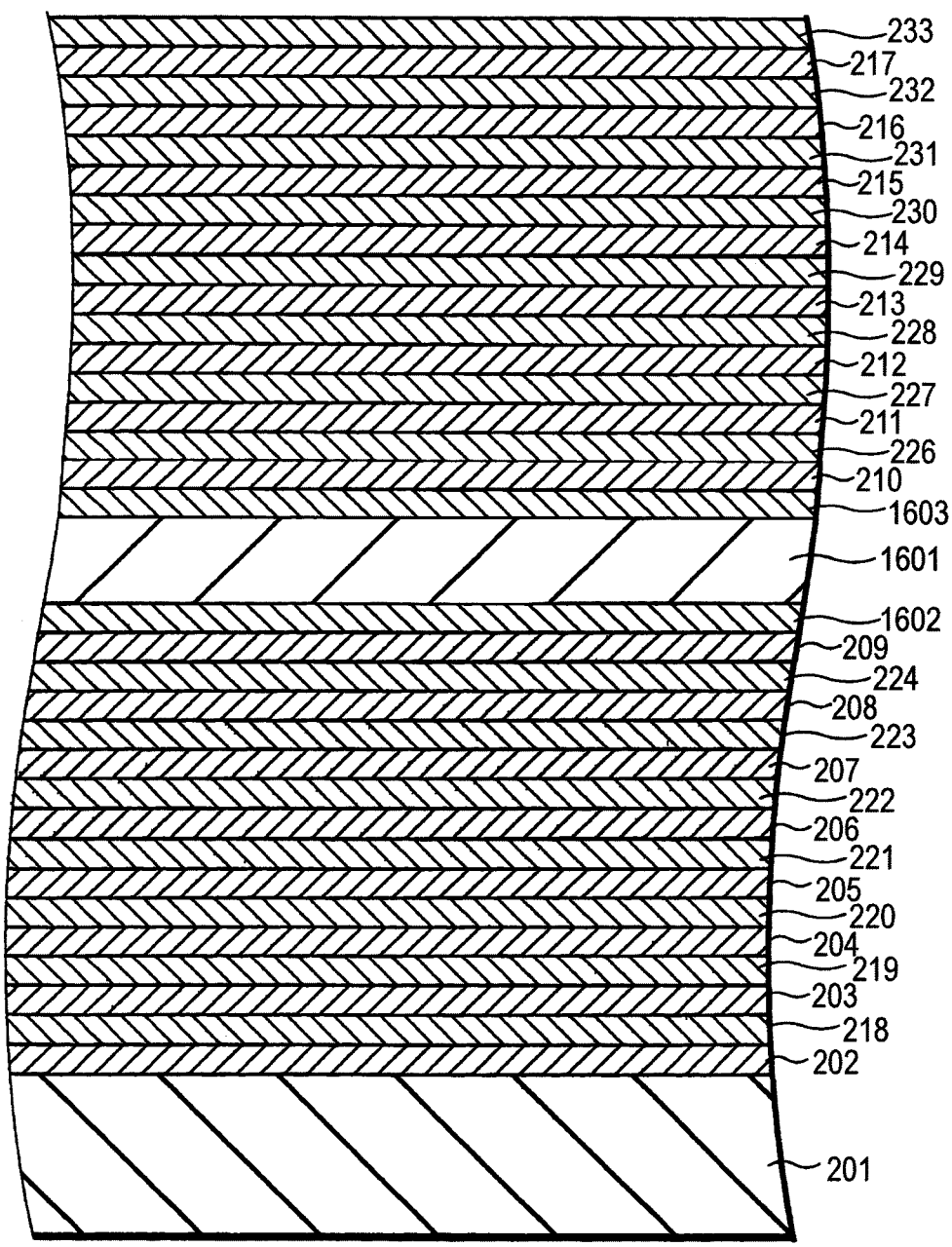
FIG. 16 is a view for explaining formation of memory plug holes according to the embodiment.
Figure 17:
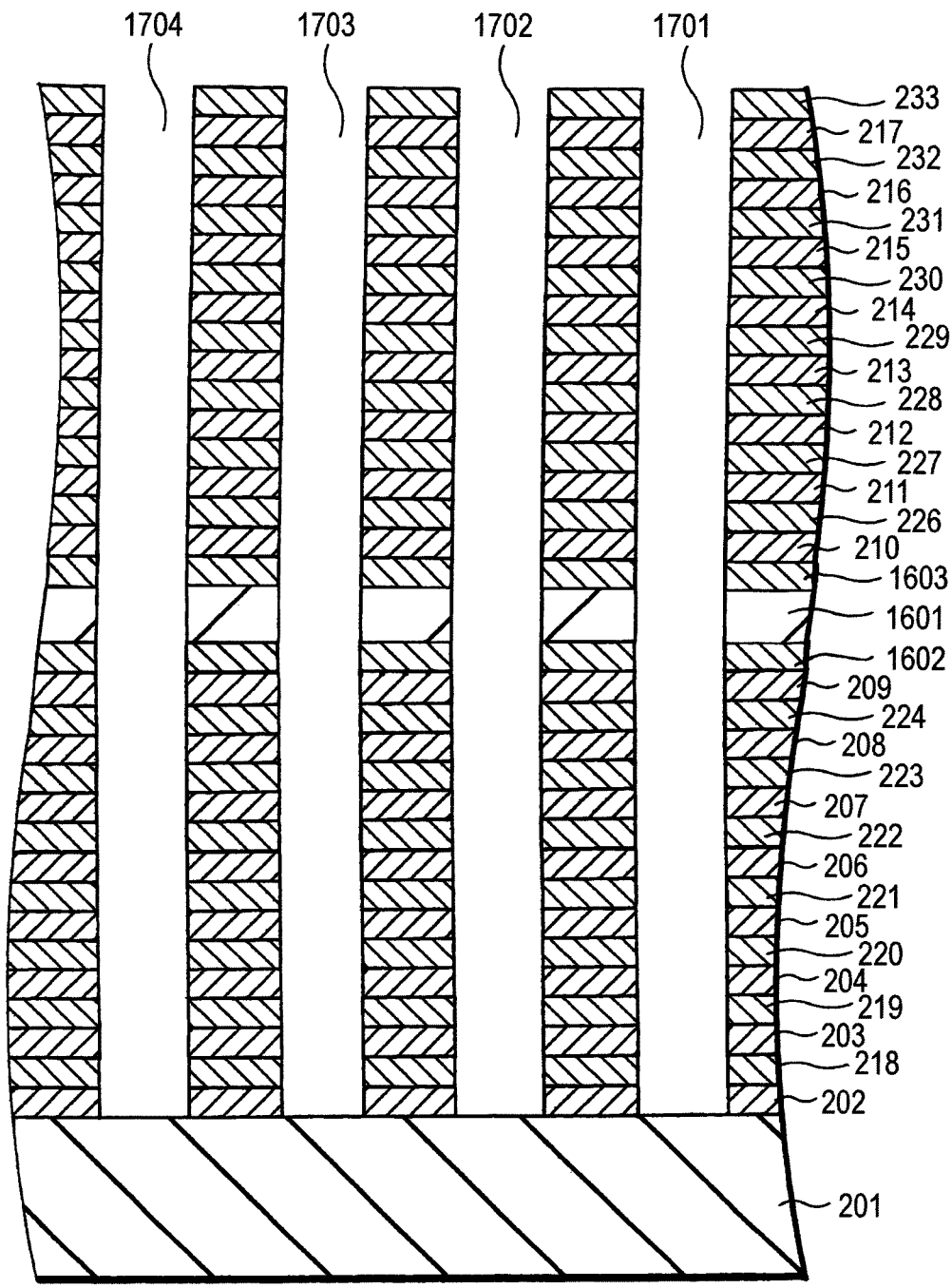
FIG. 17 is a view for explaining formation of memory plug holes according to the embodiment.

Photoresist is applied over the multilayer shown in FIG. 16 in the same fashion as in FIGS. 8 and 9, and etching is performed by use of a mask acquired through photolithography, to thus open a plurality of memory plug holes 1710, 1702, 1703, and 1704 that reach the substrate layer 201. In relation to etching of the embodiment, layers from the marker layer 1601 to the substrate layer 201 may also be etched after an etching rate is changed before and after the memory plug holes reach the marker layer 1601 by utilization of the fact that the marker layer 1601 is thick as described in connection with the second embodiment, to thus achieve a uniform etching rate. When the selectivity of the marker layer 1601 differs from that of the other layers, memory plug holes reaching the marker layer 1601 are first formed as described in connection with the first embodiment, and the marker layer 1601 is etched by changing conditions for etching. Subsequently, layers from the insulation layers 1602 to the substrate layer 201 may also be etched. Consequently, as shown in FIG. 17, there is acquired a structure in which memory plug holes 1701 to 1704 are formed. Subsequently, as mentioned previously, semiconductor pillars are formed.

In the embodiment, the thickness of a conductor layer corresponding to the marker layer 1601 is greater than the thickness of the other conductor layers. Therefore, transistors fabricated at intersection points of the marker layer 1601 and the memory plug holes can be utilized as control gate transistors. For the sake of simplicity, the control gate transistors are referred to as intermediate control transistors. In the intermediate control transistor, the conductor layer has a large thickness, and a channel length is long. Hence, a cutoff characteristic becomes high. Utilizing the increased cutoff characteristic makes it possible to enhance reliability of writing data into memory cell transistors when a self-boosting technique is used. The following descriptions are provided chiefly in relation to this point.

Figure 18:
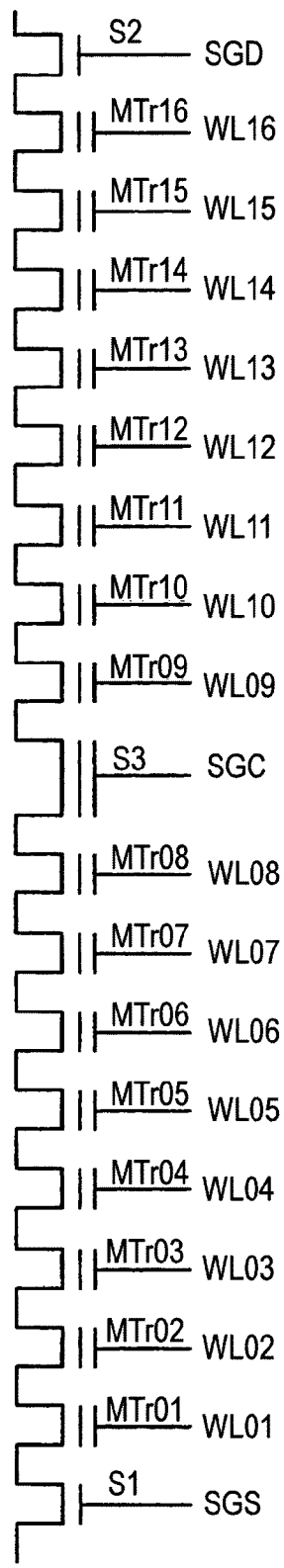
FIG. 18 is a circuit diagram equivalent to the memory string including a select transistor according to the embodiment.

FIG. 18 shows an equivalent circuit diagram in which select transistors S1 and S2 are connected to a memory string formed by use of one memory plug hole. In FIG. 17, reference symbols MTr01 to MTr08 designate memory cell transistors that are fabricated by taking, as control gates, the conductor layers 202, 203, 204, 205, 206, 208, and 209 located below the conductor layer 1601 serving as a marker layer. Reference symbols MTr09 to MTr16 designate memory cell transistors that are fabricated by taking, as control gates, the conductor layers 210, 211, 212, 213, 214, 215, 216, and 217 located above the conductor layer 1601 serving as a marker layer. Reference symbol S1 designates a source-side select gate transistor fabricated on the substrate layer 201, and reference symbol S2 designates a drain-side select gate transistor fabricated at a position higher than the insulation layer 233. In the third embodiment, an intermediate control transistor fabricated by taking, as a control gate, the conductor layer 1601 serving as a marker layer is present as S3. Consequently, reference symbols WL01, WL02, WL03, WL04, WL05, WL06, WL07, WL08, SGC, WL09, WL10, WL11, WL12, WL13, WL14, WL15, and WL16 correspond to the conductor layers 202, 203, 204, 205, 206, 207, 208, 209, 1601, 210, 211, 212, 213, 214, 215, 216, and 217, respectively. The channel length of the intermediate control transistor S3 can be increased by increasing the thickness of the conductor layer 1601. Therefore, for instance, a cutoff characteristic of the intermediate control transistor S3 can be increased. The intermediate control transistor S3 may also be fabricated into the same structure as that of the memory cell transistor. In this case, the intermediate control transistor S3 can be brought into a cutoff state at all times by accumulating electric charges in the intermediate control transistor S3. Consequently, voltage control of the intermediate control transistor S3 is facilitated.

Figure 19:
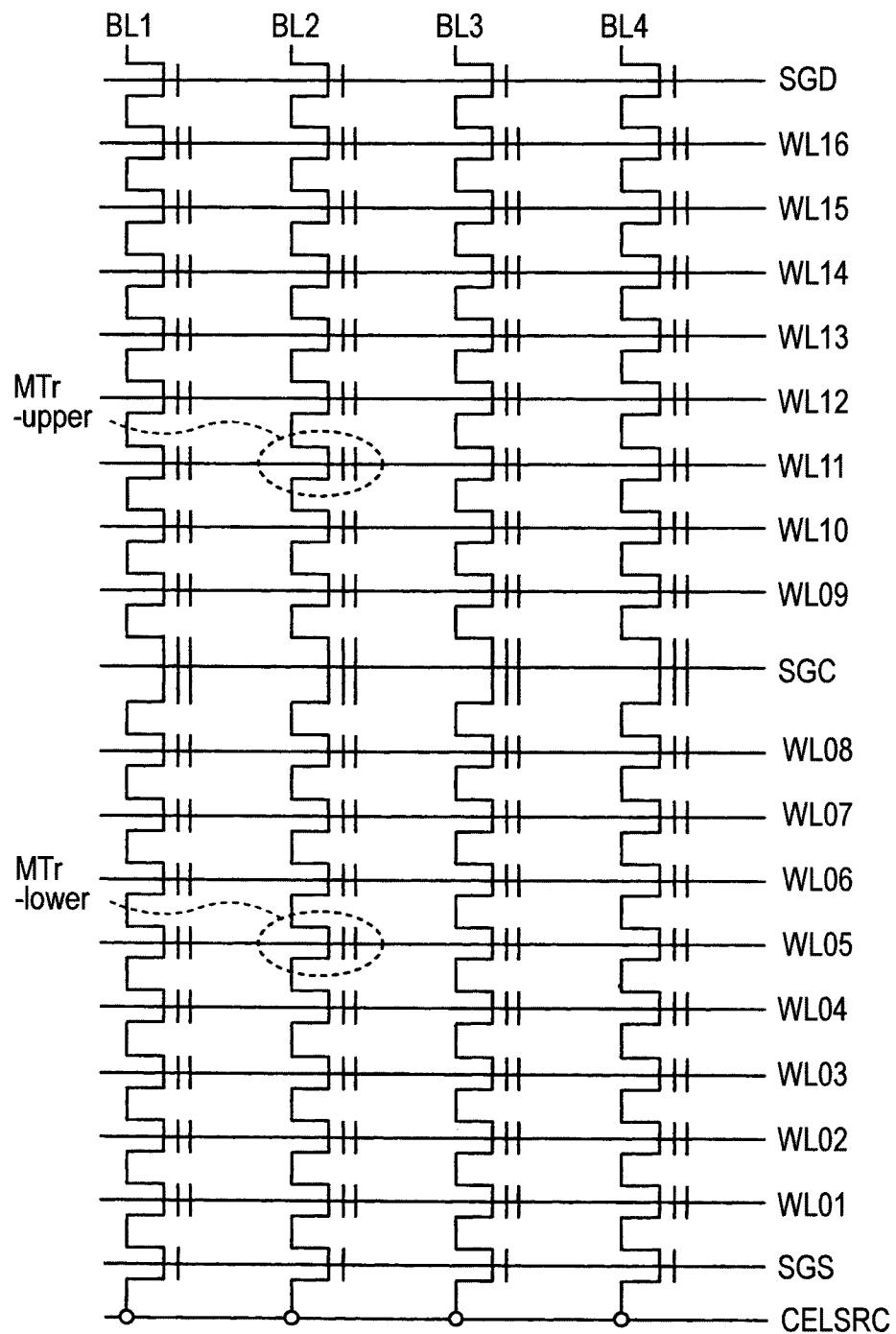
FIG. 19 is a circuit diagram equivalent to NAND flash memory according to the embodiment.

FIG. 19 shows an equivalent circuit diagram of NAND flash memory using a memory string fabricated in the memory plug holes 1701, 1702, 1703, and 1704. Specifically, bit lines BL4, BL3, BL2, and BL1 are connected to the drain of the drain-side select gate transistor S2 of the memory string fabricated in the memory contact holes 1701, 1702, and 1704. Further, the common source line CELSRC is connected to the source of the source-side select gate transistor S1 of the memory string formed in the memory contract holes 1701, 1702, 1703, and 1704. In the third embodiment, a third select gate (central-side select gate) SGC connected to the control gate of the intermediate control transistor S3 shown in FIG. 18 is connected between the word lines WL08 and WL09.

Figure 20:
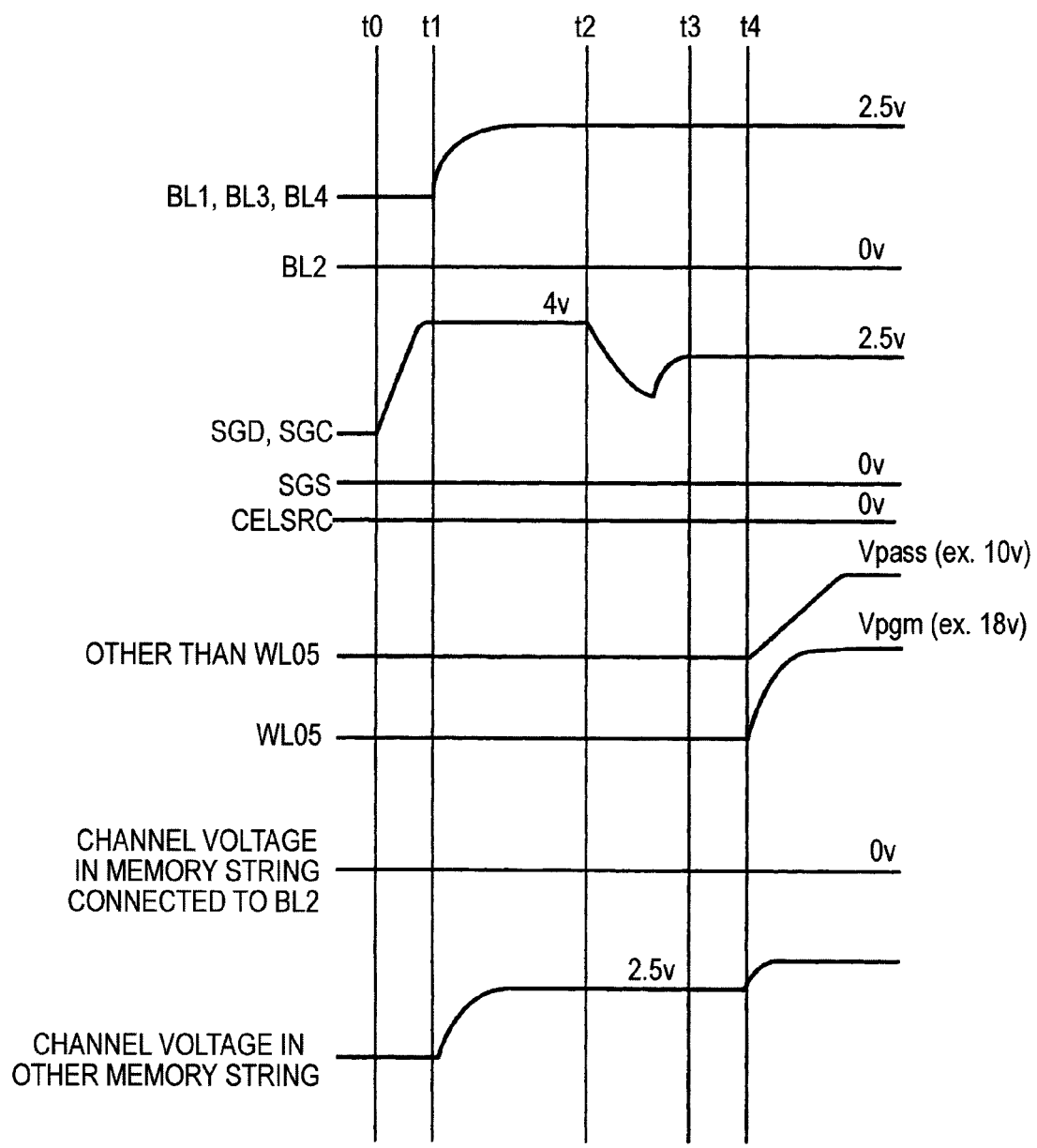
FIG. 20 is a timing chart showing voltage control performed in the embodiment.
Figure 21:
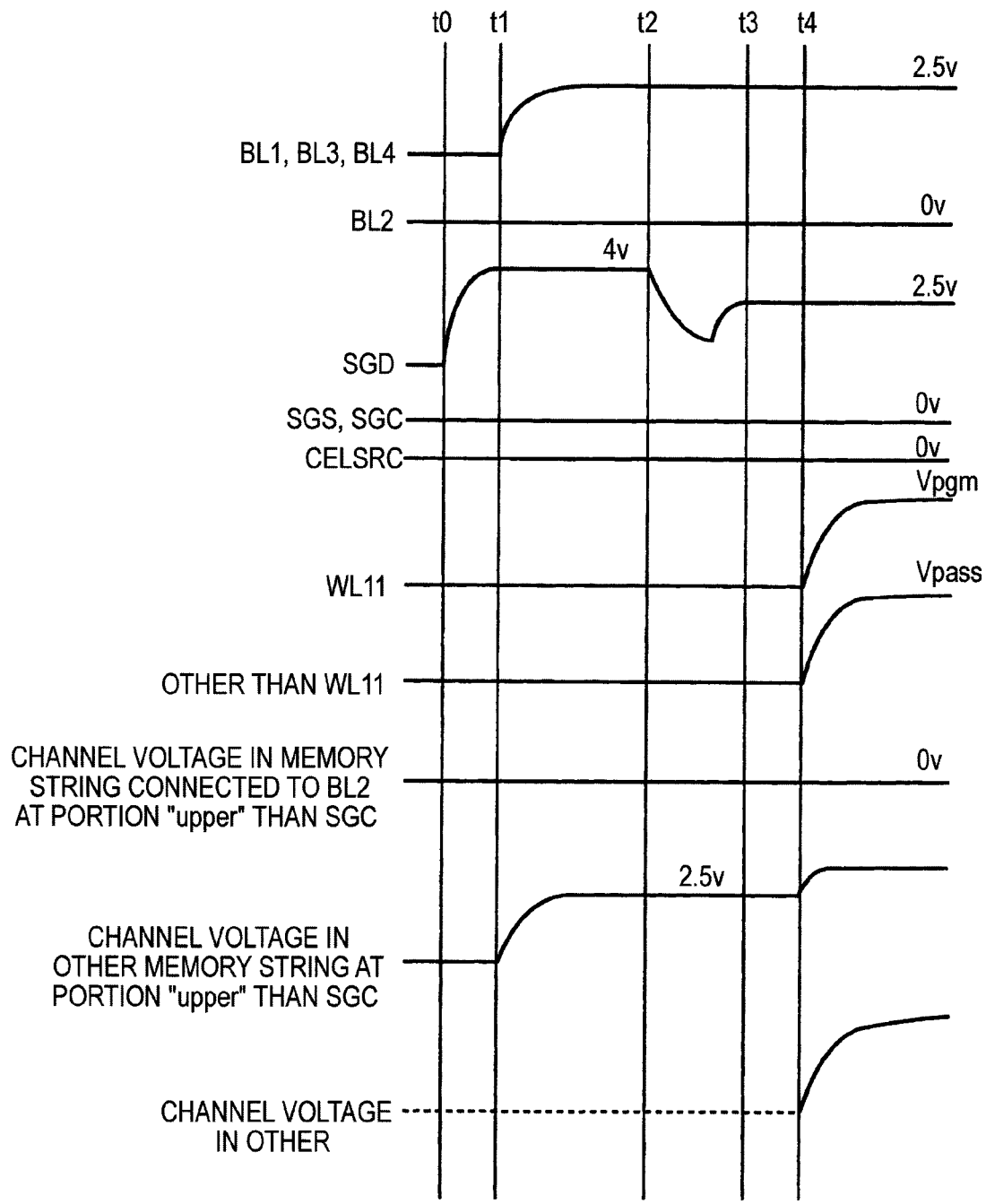
FIG. 21 is a timing chart showing voltage control performed in the embodiment.

Voltage control of the bit lines BL1 to BL4, SCG, the word lines WL16 to WL09, the third select gate SGC, the word lines WL08 to WL01, and the source-side select gate SGS performed when data are written into, of the memory string connected to the bit line BL2, an MTr-lower that is a memory cell transistor located below the SGC and an MTr-upper that is a memory cell transistor located above the SGC will be described by reference to timing charts shown in FIGS. 20 to 22. The control gate of the memory cell transistor MTr-upper is assumed to be connected to the word line WL11, and the control gate of the memory cell transistor MTr-lower is assumed to be connected to the word line WL05. In relation to the words "upper" and "lower," a memory cell transistor closer to the bit line, among the memory cell transistors of the memory string, is defined as a higher memory cell transistor. A memory cell transistor closer to the common source line is defined as a lower memory cell transistor. For instance, a memory cell transistor whose control gate is connected to a word line WL15 is a higher memory cell transistor with respect to a memory cell transistor whose control gate is connected to a word line WL10.

A case where data are written into the MTr-lower memory cell transistor will first be described by reference to FIG. 20. A voltage for the bit lines BL1, BL3, and BL4 of the memory string where data are not written is boosted at time t1 so as to achieve; for instance, 2.5V at time t2 and subsequent times. The voltage of the bit line BL2 is maintained at; for instance, 0V, at any time. The SGD and SGC start boosting from time t0 and maintain a voltage of; for instance, 4V, during a period from time t1 to time t2. In the meantime, the SGS and the common source line CELSRC maintain; for instance, 0V. As a result, the drain-side select gate transistor S2 and the intermediate control transistor S3 are turned on. Consequently, 0V is transferred to a channel of the memory cell transistor connected to the bit line BL2, and 2.5V is transferred to channels of the other memory cell transistors. The voltage of the SGD is decreased from time t2 so as to achieve; for instance, 2.5V at time t3 and subsequent times. The SGS maintains; for instance, 0V, such that the source-side select gate transistor S1 is turned off.

By controlling the voltage as mentioned above, the drain-side select gate transistor S2 and the intermediate control transistor S3, which are connected to the bit lines BL1, BL3, and BL4, are turned off. Since the source-side select gate transistor S1 is also held in an OFF position, a channel voltage of the memory cell transistors of the memory strings connected to the bit lines BL1, BL3, and BL4 can be self-boosted. Further, the drain-side select gate transistor and the intermediate control transistor S3, which are connected to the bit line BL2, are turned on, and the channel voltage of the memory cell transistors connected to the bit line BL2 can be held at 0V.

Specifically, a voltage of the word line WL05 is boosted to a write voltage Vpgm (e.g., 18V) at a time subsequent to time t4, thereby increasing the voltage of the other word lines and the voltage of the SGC to a pass voltage Vpass (e.g., 10V) at a time subsequent to t4. Since the channel voltage of the memory string connected to the bit line BL2 remains at 0V, a high voltage is applied to the control gate of the memory cell transistor MTr-lower at time t4 and subsequent times, whereupon data are written. In the memory string connected to the bit line BL2, since a voltage that is lower than Vpgm is applied to the control gates of the memory cell transistors other than the memory cell transistor MTr-lower, writing is not performed. In the memory string connected to the bit lines BL1, BL3, and BL4, the channel voltage of the memory transistors are increased by means of self-boosting, so as to follow an increase in the voltage of the word line. Hence, a voltage difference between the control gate and the memory cell channel is not increased, and writing of data is not performed.

Voltage control performed when data are written into the memory cell transistor MTr-upper will now be described. Several control methods are available as a control method for writing data into the memory cell transistor MTr-upper.

A first control method will be described by reference to FIG. 21. As in FIG. 20, the voltages of the bit lines BL1, BL3, and BL4 of the memory string into which data are not written are boosted from time t1 so as to assume a value of 2.5V at time t2 and subsequent times. The voltage of the bit line BL2 is maintained at 0V at any time. Boosting of the voltage of the SGD is started from t0, and the voltage is maintained at; for instance, 4V, during a period from t1 to t2. In the meantime, the voltages of the SGC, the SGS, and the CELSRC are maintained at; for instance, 0V. Consequently, 0V is transferred through a channel of the memory cell transistor MTr-upper of the bit line BL2, and 2.5V is transferred through channels of memory cell transistors MTr-upper of the bit lines 1, 3, and 4. Channels of the memory cell transistors MTr-lower of the bit lines BL1 through BL4 come into a floating state. A voltage of the SGD is decreased from time t2 so as to assume a value of 2.5V at time t3 and subsequent times.

Voltage control is performed as mentioned above, whereby the drain-side select gate transistor S2 connected to the bit lines BL1, BL3, and BL4 is turned off as described by reference to FIG. 20. A channel voltage of the memory cell transistor of the memory string connected to the bit lines BL1, BL3, and BL4 becomes susceptible to self-boosting. The drain-side select gate transistor S2 connected to the bit line BL2 is turned on, so that the channel voltage of the memory cell transistor MTr-upper connected to the bit line BL2 can be brought into 0V.

Moreover, the voltage of the SGC holds 0V in such a way that the intermediate control transistor S3 is cutoff. Hence, memory cell transistors located between the SGC and the SGS that are connected to the bit line BL2 also become susceptible to self-boosting.

At time t4, the voltage of the word line WL11 is boosted to Vpgm, and the other word lines are boosted to Vpass. Thereupon, the channel voltage of the memory cell transistors located above the SGC in the memory string connected to the bit line BL2 comes to 0V. The channel voltage of the memory cell transistors located above the SGC, among the memory cell transistors of the memory string connected to the bit lines BL1, BL3, and BL4, increase from time t1, to thus reach; for instance, 2.5V, and further increase at time t4 and subsequent times for reasons of self-boosting. Moreover, the channel voltage of the memory cell transistors other than the above-described memory cell transistors increase at time t4 and subsequent times by means of self-boosting operation. As a result, a high voltage is applied between the control gates and the channels of the memory cell transistors MTr-upper, whereby data are written.

In the general NAND flash memory, when writing data into a memory cell transistor belonging to a memory string, channel voltage of all memory cell transistors belonging to the memory string come to 0V. And, a positive voltage Vpass is applied to the memory cell transistors where data are not to be written. Therefore, there is a risk of erroneous data writing into memory cell transistors that are not to be subjected to the data writing. However, according to the third embodiment, the intermediate control transistor S3 that is located in the middle of the memory cell string and that exhibits a high cutoff characteristic is turned off by the SGC, thereby reducing the range of memory cell transistors on which the Vpass are applied. As a result, the number of memory cell transistors being vulnerable to erroneous writing can be reduced.

By performing the data writing into the memory cell transistors in an order sequentially from the part close to the SGS, the risk of erroneous writing can be further lessened.

Figure 22:
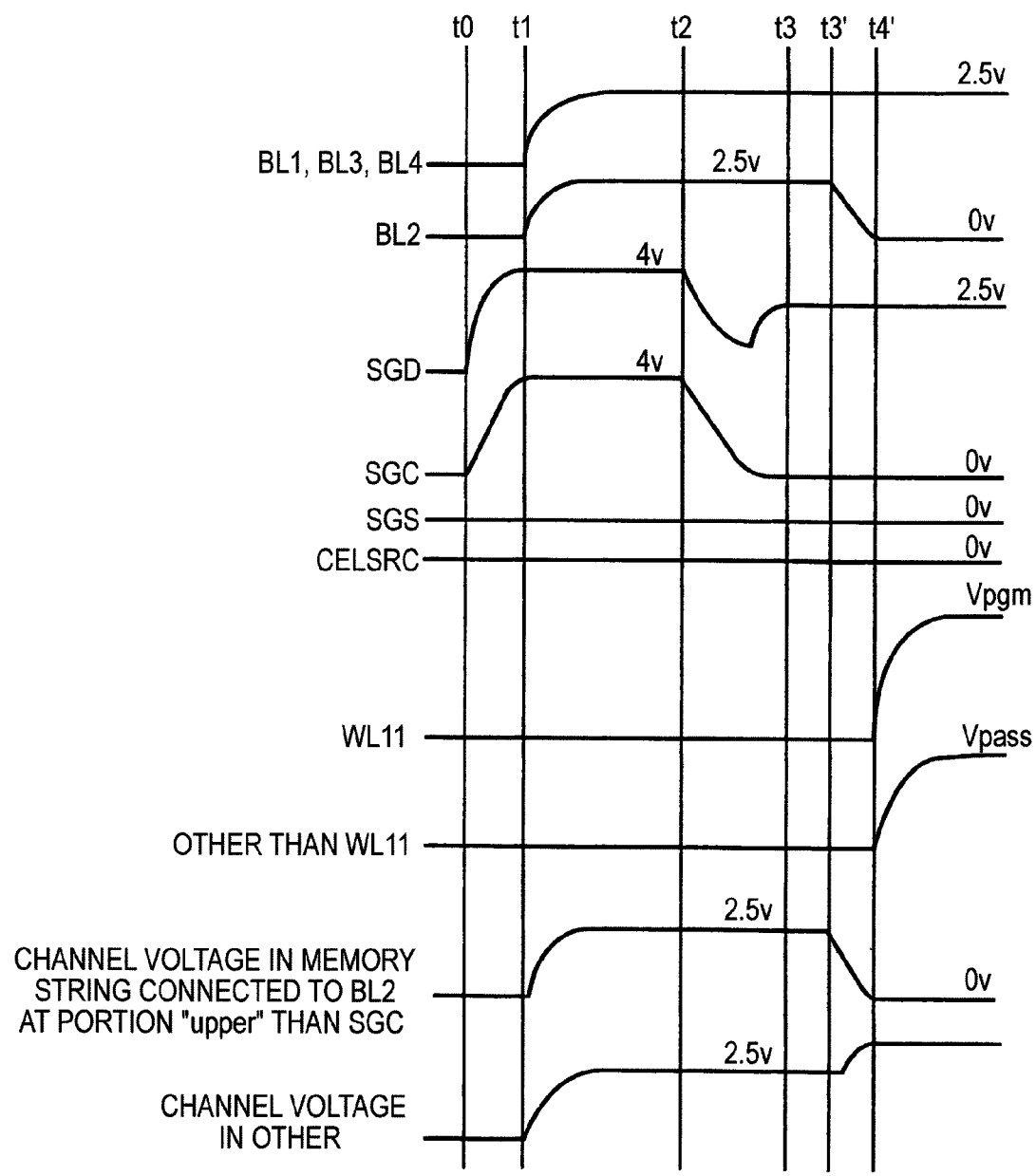
FIG. 22 is a timing chart showing voltage control performed in the embodiment.

FIG. 22 is a timing chart for describing another control method for writing data into the memory cell transistors MTr-upper. A first difference between the timing charts shown in FIGS. 21 and 22 lies in that the bit line BL2 is not maintained at 0V at any time and boosted to; for instance, 2.5V, from time t1 as in the case of the voltages of the bit lines BL1, BL2, and BL3. A second difference lies in that the SGC is not maintained at; for instance, 0V, at any time but may also be set to a voltage that starts to increase at time t0 and at which the intermediate control transistor S3 is turned on during a period from time t1 to t2; for instance, 4V. Consequently, 2.5V, for instance, is transferred to channels of all memory cell transistors. Subsequently, the voltage of the SGC is decreased from time t2 and maintained at; for instance, 0V, at time t3 and subsequent times. The voltage of the bit line BL2 is decreased from a time t3' located in the middle of times t3 and t4 and kept at; for instance, 0V, at time t4 and subsequent times. A select transistor connected to the BL2 is turned on by a decrease in the voltage of the bit line BL2, whereupon channel voltage of the memory cell transistors located above the intermediate select transistor S3 of the memory string of the bit line BL2 also decrease to 0V. However, since the intermediate select transistor S3 is already turned off, memory cell transistors located below the intermediate select transistor S3 of the memory string connected to the bit line BL2 become susceptible to self-boosting.

As described above, the channel voltage of the memory cell transistors MTr-upper connected to the bit line BL2 come to 0V. In the meantime, the channel voltage of the memory cell transistors MTr-lower (the memory cell transistors located between the SGC and the SGS) connected to the bit line BL2 comes to; for instance, 2.5V, at time t2 and subsequent times. At time t4 at which data are written and subsequent times, the SGC is already turned off and, therefore, can become susceptible to self-boosting. Consequently, the range of memory cell transistors subjected to application of the Vpass voltage can be reduced. Moreover, the memory cell channels of the memory cell transistors MTr-lower are not in a floating state before being self-boosted, and 2.5V has already been transferred to the memory cell transistors MTr-lower. Hence, the chance of occurrence of erroneous writing is reduced. As a result, the number of memory cell transistors being liable to erroneous writing can be reduced.

The range of memory cell transistors to which the Vpass is applied can be further reduced by forming a plurality of marker layers. As a result, the number of memory cell transistors being liable to erroneous writing can be further reduced.

In the above description, it has been described that the cutoff characteristic of transistors fabricated in a conductor layer can be increased by making the conductor layer thicker than the other conductor layers and that the number of memory cell transistors being liable to erroneous writing can be reduced. Even in a nonvolatile semiconductor storage device where memory cell transistors are two-dimensionally arranged, transistors exhibiting a high cutoff characteristic can be arranged in principle at any arbitrary position in the memory string. However, there are limitations, such as a two-dimensional fashion, it is desirable that transistors to be arranged should have the same gate width. If transistors having different gate widths are mixed, a failure will arise during patterning of a photoresist or during etching, which in turn poses difficulty in enhancing yield. However, when memory cells are three-dimensionally arranged, the essential requirement is to thicken a conductor layer that is to act as a marker layer. Hence, such difficulty can be eliminated.

The present invention is not limited to the embodiments described above and can be practiced in various modes without departing from the scope of gist of the present invention. For example, the marker layer is not limited to single-layer structure. Multi-layer structure of stacked insulation layers or stacked conductor layers may be adapted to the marker layer. Further, the thickness of the marker layer may be changed by adjusting the number of the stacked layers.

What is claimed is:

1. A method for manufacturing a nonvolatile semiconductor storage device, the method comprising:
   forming a lower stacked portion on a substrate, by alternately stacking a plurality of conductor layers and a plurality of insulation layers;
   forming a marker layer on the lower stacked portion;
   forming an upper stacked portion on the marked layer, by alternately stacking a plurality of conductor layers and a plurality of insulation layers;
   forming a memory plug hole in the upper stacked portion by performing a first etching process;
   further forming the memory plug hole in the marker layer by performing a second etching process;
   further forming the memory plug in the lower stacked portion by performing a third etching process;
   forming a charge accumulation film on an inner surface of the memory plug hole; and
   forming a semiconductor pillar inside the memory plug hole through the charge accumulation film.

2. The method according to claim 1, wherein the first etching process has an etching condition adjusted so that an etching rate for the upper stacked portion is higher than that for the marker layer.

3. The method according to claim 1, wherein the second etching process has an etching condition adjusted so that an etching rate for the marker layer is higher than that for the lower stacked portion.

4. The method according to claim 1, wherein the third etching process has an etching condition same as that of the first etching process.

* * * * *